(12) United States Patent
Dinneen et al.

(10) Patent No.: US 9,822,460 B2
(45) Date of Patent: Nov. 21, 2017

(54) METHODS AND APPARATUSES FOR ELECTROPLATING AND SEED LAYER DETECTION

(71) Applicant: Lam Research Corporation, Fremont, CA (US)

(72) Inventors: Daniel Mark Dinneen, Tigard, OR (US); Steven T. Mayer, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 765 days.

(21) Appl. No.: 14/160,471

(22) Filed: Jan. 21, 2014

(65) Prior Publication Data

US 2015/0206770 A1 Jul. 23, 2015

(51) Int. Cl.
*C25D 17/12* (2006.01)
*C25D 21/12* (2006.01)
(Continued)

(52) U.S. Cl.
CPC ............. *C25D 17/16* (2013.01); *C25D 3/38* (2013.01); *C25D 7/123* (2013.01); *C25D 17/001* (2013.01);
(Continued)

(58) Field of Classification Search
CPC ........ C25D 7/12; C25D 7/123; C25D 17/001; C25D 21/12; H01L 22/12
See application file for complete search history.

(56) References Cited

U.S. PATENT DOCUMENTS 5,096,550 A * 3/1992 Mayer .................. C25F 3/02
204/212
6,156,167 A 12/2000 Patton et al.
(Continued)

FOREIGN PATENT DOCUMENTS

CN 102428546 A 4/2012
WO WO 2010/133989 11/2010

OTHER PUBLICATIONS

U.S. Appl. No. 13/928,141, filed Jun. 26, 2013, entitled "Electroplating and Post-Electrofill Systems With Integrated Process Edge Imaging and Metrology Systems."
(Continued)

*Primary Examiner* — Brian W Cohen
(74) *Attorney, Agent, or Firm* — Weaver Austin Villeneuve & Sampson LLP

(57) ABSTRACT

Disclosed herein are methods and apparatuses for electroplating which employ seed layer detection. Such methods and related apparatuses may operate by selecting a wafer for processing, measuring from its surface one or more in-process color signals having one or more color components, calculating one or more metrics, each metric indicative of the difference between one of the in-process color signals and a corresponding set of reference color signals, determining whether an acceptable seed layer is present on the wafer surface based on whether a predetermined number of the one or more metrics are within an associated predetermined range which individually corresponds to that metric, and either electroplating the wafer when an acceptable seed layer is present or otherwise designating the wafer unacceptable for electroplating. The foregoing may then be repeated for one or more additional wafers to electroplate multiple wafers from a set of wafers.

15 Claims, 11 Drawing Sheets

(51) Int. Cl.
- *C25D 17/16* (2006.01)
- *H01L 21/67* (2006.01)
- *H01L 21/66* (2006.01)
- *C25D 3/38* (2006.01)
- *C25D 7/12* (2006.01)
- *C25D 17/00* (2006.01)

(52) U.S. Cl.
CPC ........ *C25D 21/12* (2013.01); *H01L 21/67011* (2013.01); *H01L 22/12* (2013.01)

(56) References Cited

U.S. PATENT DOCUMENTS

| | | | |
|---|---|---|---|
| 6,930,782 B1 * | 8/2005 | Yi | B24B 21/04 356/504 |
| 7,142,300 B2 | 11/2006 | Rosengaus | |
| 7,423,269 B1 | 9/2008 | Azordegan et al. | |
| 7,449,098 B1 | 11/2008 | Mayer et al. | |
| 7,623,228 B1 | 11/2009 | Muckenhirn | |
| 7,728,965 B2 | 6/2010 | Haller et al. | |
| 7,760,929 B2 * | 7/2010 | Orbon | G03F 1/84 382/148 |
| 7,780,867 B1 | 8/2010 | Mayer et al. | |
| 7,787,114 B2 | 8/2010 | Wolters et al. | |
| 7,811,424 B1 | 10/2010 | Woods et al. | |
| 9,735,035 B1 | 8/2017 | Ranjin et al. | |
| 2003/0022493 A1 | 1/2003 | Jiang et al. | |
| 2004/0218804 A1 | 11/2004 | Affleck et al. | |
| 2005/0013476 A1 | 1/2005 | Simpkins | |
| 2005/0122509 A1 | 6/2005 | Backhauss | |
| 2005/0217707 A1 | 10/2005 | Aegerter et al. | |
| 2005/0280807 A1 | 12/2005 | Backhauss et al. | |
| 2006/0000716 A1 * | 1/2006 | Wilson | C25D 5/08 205/82 |
| 2007/0087530 A1 * | 4/2007 | Yim | H01L 21/76871 438/458 |
| 2007/0139645 A1 | 6/2007 | Shen et al. | |
| 2008/0007726 A1 | 1/2008 | Fairley et al. | |
| 2008/0013822 A1 | 1/2008 | Pai et al. | |
| 2008/0047827 A1 * | 2/2008 | Cheng | C25D 17/00 204/242 |
| 2008/0293333 A1 | 11/2008 | Zhang et al. | |
| 2009/0059236 A1 | 3/2009 | Meeks et al. | |
| 2009/0116727 A1 | 5/2009 | Jin et al. | |
| 2009/0122304 A1 | 5/2009 | Jin et al. | |
| 2009/0205676 A1 | 8/2009 | Nakagawa | |
| 2009/0268953 A1 | 10/2009 | Crucs | |
| 2010/0055924 A1 | 3/2010 | Ganesan et al. | |
| 2011/0054659 A1 | 3/2011 | Carlson et al. | |
| 2011/0103679 A1 | 5/2011 | Campbell | |
| 2011/0139757 A1 | 6/2011 | Millman, Jr. et al. | |
| 2011/0218762 A1 | 9/2011 | Chen et al. | |
| 2013/0005056 A1 | 1/2013 | Kim et al. | |
| 2014/0079311 A1 * | 3/2014 | Amzaleg | G01N 21/9501 382/144 |
| 2014/0367267 A1 * | 12/2014 | Egan | G01B 7/105 205/84 |
| 2015/0001087 A1 * | 1/2015 | Dinneen | H01L 21/67253 205/81 |
| 2017/0221740 A1 | 8/2017 | Ranjin et al. | |

OTHER PUBLICATIONS

U.S. Appl. No. 15/011,363, filed Jan. 29, 2016, entitled "Methods and Apparatuses for Estimating On-Wafer Oxide Layer Reduction Effectiveness via Color Sensing."

U.S. Office Action dated Jul. 19, 2016 issued in U.S. Appl. No. 13/928,141.

U.S. Notice of Allowance dated Nov. 4, 2016 issued in U.S. Appl. No. 13/928,141.

U.S. Office Action dated Oct. 19, 2016 issued in U.S. Appl. No. 15/011,363.

Chinese First Office Action dated Aug. 17, 2016, issued in Application No. CN 201410299510.3.

U.S. Notice of Allowance dated May 12, 2017, issued in U.S. Appl. No. 13/928,141.

Chinese Second Office Action dated Apr. 14, 2017, issued in Application No. 201410299510.3.

U.S. Notice of Allowance dated Mar. 30, 2017, issued in U.S. Appl. No. 15/011,363.

U.S. Notice of Allowance dated Sep. 14, 2017 issued in U.S. Appl. No. 13/928,141.

U.S. Notice of Allowance [Corrected Notice of Allowability] dated Jul. 13, 2017 issued in U.S. Appl. No. 15/011,363.

U.S. Appl. No. 15/640,047, filed Jun. 30, 2017, Ranjin et al.

* cited by examiner

TOP VIEW

Color space CIE Lab

Color space for color test (each color range is the same size)

Each color is defined by the color location (L*; a*; b*)
L* = Luminosity value (black = 0; white = 100)
a* = Green / red value (green = -100; red = +100)
b* = Blue / yellow value (blue = -100; yellow = +100)

METHODS AND APPARATUSES FOR ELECTROPLATING AND SEED LAYER DETECTION

FIELD OF THE INVENTION

This disclosure relates to the fabrication of electronic devices, the electroplating of semiconductor substrates, electroplating systems and apparatuses having integrated and/or in situ metrology systems for examining semiconductor wafers during processing, and methods of performing metrology and examination of semiconductor wafers during processing.

BACKGROUND

The fabrication of integrated circuits often involves one or more steps of electroplating a layer of conductive metal onto the surface of a semiconductor wafer. For example, in some IC fabrication procedures, an electroplating operation may be used to fill with metal the various features formed in the surface of a semiconductor wafer such as, for instance, the trenches and vias used as conductive paths between various circuit elements.

In a typical electroplating operation, the surface of the wafer is exposed to an electroplating bath fluid which contains dissolved ions of the metal to be electroplated, and an electrical circuit is created between an electrode in the bath (which serves as an anode) and surface of the wafer (which serves as the cathode). Flow of current through this circuit upon application of an applied voltage causes electrons to flow to the cathode surface and reduce dissolved metal ions in its vicinity thereby resulting in the plating out of solution of neutral elemental metal onto the surface of the wafer.

However, for this circuit to be completed and for electrochemical reduction of dissolved metal ions to occur, the surface of the wafer (serving as the circuit's cathode) must be, at least to a certain extent, relatively conductive. Accordingly, since the bare surface of a semiconductor wafer is not generally substantially conductive, the actual electroplating step in an electroplating operation is often preceded by the deposition of a conductive seed layer which provides the necessary conductive surface. Deposition of the seed layer may be accomplished by any feasible method of depositing the seed material. Suitable methods may include, for example, physical vapor deposition (PVD), chemical vapor deposition (CVD), plasma-enhanced chemical vapor deposition (PECVD), conformal film deposition (CFD), atomic layer deposition (ALD), and the like. Oftentimes, seed layer deposition and electroplating is followed by an edge bevel removal (EBR) operation that removes seed metal deposited at the edge of the wafer where its presence is not desired via the application of a thin viscous flow of etchant solution over the wafer's edge.

SUMMARY OF THE DISCLOSURE

Disclosed herein are methods of electroplating a plurality of wafers from a set of semiconductor wafers. The methods may include selecting a wafer from the set for processing, measuring from the surface of the wafer being processed one or more in-process color signals having one or more color components, and calculating one or more metrics, each metric indicative of the difference between one of the in-process color signals and a corresponding set of reference color signals.

The one or more in-process color signals may include a first color signal measured at a point on the wafer surface. In some embodiments, the one or more in-process color signals may further include a second color signal measured at a point on the wafer surface. In certain such embodiments, the first color may be measured from a point within the interior region of the wafer surface and the second color signal may be measured from a point within the edge region of the wafer surface.

The one or more metrics may include a first metric calculated from the first in-process color signal and a corresponding first reference set of color signals having one or more color components. In some embodiments, the one or more metrics may further include a second metric calculated from the second in-process color signal and a corresponding second reference set of color signals having one or more color components.

From the one or more metrics, the methods may further include determining whether an acceptable seed layer is present on the wafer surface based on whether a predetermined number of the one or more metrics are within an associated predetermined range which individually corresponds to that metric, and either electroplating the wafer when an acceptable seed layer is present or otherwise designating the wafer unacceptable for electroplating. These operations may be repeated for one or more additional wafers from the set of wafers.

Also disclosed herein are electroplating system which may include one or more wafer storage devices for storing, loading, and unloading wafers, an electroplating module, and a seed layer analysis system. The electroplating module may include a cell for containing an anode and electroplating solution during electroplating, a wafer holder for holding and rotating a wafer during electroplating, and a power supply for supplying current to the wafer during electroplating. In some embodiments, the electroplating system may additionally include a robotic wafer transfer mechanism for transferring wafers to and from the wafer storage device, the electroplating module, and/or the seed layer analysis system.

The seed layer analysis system may include a color sensor for measuring from the surface of the wafer being processed one or more in-process color signals having one or more color components, and also may include color analysis logic. The color analysis logic may analyze the one or more in-process color signals and determining whether there is an acceptable seed layer present. In some embodiments, the color analysis logic may include logic for calculating one or more metrics, each metric indicative of the difference between one of the in-process color signals and a corresponding set of reference color signals, and logic for determining whether an acceptable seed layer is present on the surface of the wafer based on whether each metric corresponding to each in-process color signal is within a predetermined range corresponding to that metric. In certain such embodiments, the color analysis logic may further include logic for signaling that the wafer is not acceptable for electroplating when an acceptable seed layer is not present;

The disclosed electroplating systems may also include a system controller for operating the electroplating system. The system controller may be configured to receive signals from the seed layer analysis system and further configured to operate the robotic wafer transfer mechanism to prevent the electroplating of a wafer when the seed layer analysis system signals that a wafer is not acceptable for electroplating.

Also disclosed herein are methods of electroplating a plurality of wafers from a set of semiconductor wafers which may include selecting a wafer from the set for processing and measuring a first set of one or more in-process color signals from one or more points within the interior region of the surface of the wafer, each color signal having one or more color components, and also measuring a second set of one or more in-process color signals from one or more points within the edge region of the surface of the wafer, each color signal having one or more color components. In certain such embodiments, a metric may be calculated indicative of the difference between the color signals in the first and second sets of in-process color signals, and the methods may proceed by determining whether an acceptable seed layer is present on the wafer surface based on whether said metric is within a predetermined range, and then either electroplating the wafer when an acceptable seed layer is present or otherwise designating the wafer unacceptable for electroplating. These operations may then be repeated for one or more additional wafers from the set of wafers.

DETAILED DESCRIPTION

Figure 1:
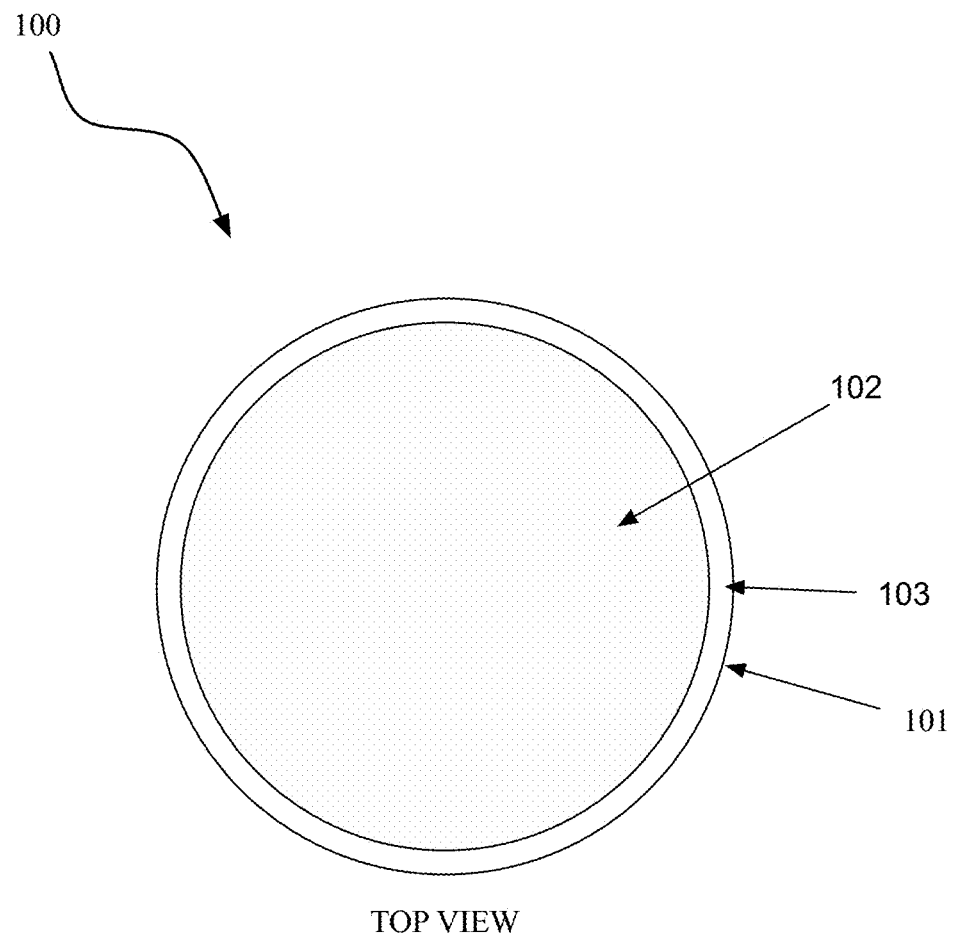
FIG. 1 schematically illustrates the top surface of a typical wafer having an interior active circuit region and an edge region, located between the edge of the wafer and the interior region.

In the following disclosure, numerous specific embodiments are set forth in order to provide a thorough understanding of the inventive concepts disclosed herein. However, it will be appreciated by those skilled in the art that the inventive concepts disclosed herein may in many cases be practiced with or without certain of these specific details, such as by the substitution of alternative elements or steps, or the omission of certain elements or steps, while remaining within the scope and spirit of the inventive concepts disclosed herein. Furthermore, where certain processes, procedures, operations, steps, elements, modules, components, and/or systems are already well-known to those skilled in the art, they may not be described herein in as great of detail as necessarily possible, in order that the important aspects of the disclosed inventive concepts are not unnecessarily obscured.

Seed Layer Presence Detection and Acceptability Determination Methods

Attempted electroplating of a semiconductor wafer lacking a seed layer not only generally substantially fails to deposit the desired layer of conducive metal, it also frequently results in severe damage to the wafer itself. Thus, in many circumstances, an unseeded wafer may not be simply returned to the previous seed layer deposition step for another try, but instead must be disposed of, potentially cumulatively resulting in a significant loss to a semiconductor fabrication procedure's net wafer production. Accordingly, methods and apparatuses for preventing the attempted electroplating of unseeded semiconductor wafers are desired, as well as electroplating systems incorporating such methods and apparatuses.

For these reasons, it is desirable to determine the presence or absence of a seed layer on a semiconductor wafer prior to initiating an electroplating operation on the wafer, and thus it is valuable to integrate this capability into electroplating operations and apparatuses. Moreover, beyond establishment of the presence of the seed layer, the capability of analyzing a seed layer to estimate its thickness is also advantageous, because seed layers of a certain thickness are generally desired and/or required in electroplating operations.

Accordingly, disclosed herein are methods of determining the presence or absence of a seed layer on a wafer which is intended to serve as a basis for subsequent electroplating operations and, in some embodiments, additionally determining the approximate thickness of the seed layer to serve as an additional electroplating diagnostic. These methods may operate by detecting the presence of the seed layer through the use of one or more color signals measured from one or more points on the wafer's surface where the seed layer is expected to be found (if present). Note that, depending on the embodiment, a color signal could comprise a single color component or multiple color components as described in greater detail below. Furthermore, depending on the embodiment, one or more color signals may be measured from one or more points within the interior region of a wafer's surface, or from one or more points within the edge region of a wafer's surface, or from both regions. For instance, in some embodiments, the one or more color signals may a first color signal measured at a point within the interior region of the wafer surface, and/or a second color signal measured at a point within the edge region of the wafer surface. In some embodiments, the second color signal may also be measured at a point with the interior region of the wafer surface. In some embodiments, the one or more color signals may include third, fourth, fifth, sixth, seventh, eight, ninth, tenth, etc. color signals, any of which may be measured at a point within the edge region or interior region of the wafer surface, depending on the embodiment.

The value of one or more metrics may be calculated from one or more color signals measured from the surface of the wafer being tested—which may be referred to as "probe" signals—which tend to indicate the presence or absence of a seed layer on the test wafer. For instance, each metric may be indicative of the difference between one of the measured color signals and a corresponding set of reference color signals. Thus, in some embodiments, the metrics may include a first metric calculated from a first measured color signal and a corresponding first reference set of color signals having one or more color components; in certain such embodiments, the metrics may further include a second metric calculated from a second measured color signal and a corresponding second reference set of color signals having one or more color components; in certain such embodiments, the metrics may further include a third metric calculated from a third measured color signal and a corresponding third reference set of color signals having one or more color components; and so forth for optional fourth, fifth, sixth, seventh, eighth, ninth, tenth, etc. probe color signals, and corresponding sets of reference color signals and calculated metrics. Of course, it should be understood that if first and second measured probe color signals correspond to locations on the wafer which are expected to yield similar color signals if a seed layer is present, both first and second color signals may both be compared to the same reference set of color signals, which would then serve as both the first and second sets of reference color signals using the terminology above. And, likewise, the same may hold for embodiments described in terms of three or more reference sets of color signals.

The one or more reference color signals may be stored color signals measured from points on the surface of one or more reference wafers where a seed layer was known to be located when the measurement was made. In some embodiments, the one or more reference color signals may be stored color signals previously measured from points on the surface of one or more wafers which were previously processed and determined to have a seed layer present, as described in more detail below. As with the probe color signals, the reference color signals may be measured at points within the interior regions or edge regions of wafers having a seed layer present. Generally, a set of reference color signals will correspond to the probe color signals which are being compared to it. Thus, in some embodiments, if a wafer is tested by measuring a first color signal from an interior region of its surface, then the first reference set of color signals to which it is compared would also have been measured from the interior region of one or more wafers known to have an acceptable seed layer present. Likewise, if, for example, the wafer is also tested by measuring a second color signal from an interior region of its surface, then the second reference set of color signals to which this test signal is compared would also have been measured from the edge region of one or more wafers known to have an acceptable seed layer present. In other embodiments, if both first and second probe color signals are measured from the interior region of a wafer, then they may both be compared against a reference set measured from the interior regions of one or more wafers having an acceptable seed layer present and, as described above, in some embodiments, the same set of measurements may serve as references for comparing both measured probe signals.

The metric which serves as a basis of comparison between probe and reference color signals may provide a quantitative assessment of the difference between the measured probe color signal and one or a set of reference color signals. If the set of reference color signals is characteristic of wafers having an acceptable seed layer present, and the value of the metric is within a predetermined range, then it may be surmised that the test wafer in question has an acceptable seed layer present. For instance, in some embodiments, the metric may be indicative of the magnitude of the vector difference between a measured probe color signal and the vector average of a corresponding reference set of color signals, and if the metric is within a predetermine range indicative of the average deviation associated with the vector average, then it may be surmised that the wafer in question has an acceptable seed layer present. In certain embodiments, the predetermined range may be the average deviation associated with the vector average, or 2 times the average deviation associated with the vector average, or 3 times the average deviation associated with the vector average, or any predetermined range whose endpoints are set according to some multiple of the average deviation associated with the vector average.

It is noted, that additionally, in some embodiments, the calculated metric may also be used to infer the approximate thickness of the seed layer if it is present. This may be, for example, in embodiments where there are several sets of reference color signals corresponding to wafers having seed layers present of varying thicknesses, which then may provide the opportunity for a comparison metric to also give an indication of the thickness of the seed layer on the test wafer.

The mathematical function representing the comparison metric could be implemented as an analytic function of the color signals, it could be implemented in a look-up table, or it could potentially be implemented using some other computational methodology (a mixture of analytic function evaluation and table look-up, for instance). In the example just described, one suitable mathematical function of the color signals which could serve as a suitable comparison metric is the magnitude of the vector difference between the one or more color components of the probe color signal and the vector average of the reference color signals. If the probe and reference color signals consist of a single color component (for example, the sole color component could represent the intensity of a narrow band of blue light) then the vector difference reduces to the absolute value of the scalar difference between the probe color signal and the scalar average of the set of reference color signals. If there are two or more components, then the magnitude of the aforementioned vector difference would generally be written as $$\Delta E = \sqrt{\sum_{i=1}^{N} \left\{ c_i(\text{probe}) - \frac{1}{n} \sum_{j=1}^{n} c_i(\text{reference } j) \right\}^2}$$

where $c_i$ is the $i^{th}$ component of the probe and reference color signals, N is the number of color signal components, and n is the number of color signals in the reference set (as is readily understood by one having ordinary skill in the art). Of course, a metric consisting of a scaled version of the magnitude of this vector difference would work similarly (the scaling possibly due to unit conversion, for example), as would various monotonic functions of the vector difference magnitude. One of ordinary skill in the art will readily appreciate that the specific functional form of the metric is not critical as long as it results in a value indicative of the difference between the probe and the set of reference color signals. If the metric is chosen to be a monotonically increasing function of the magnitude of the vector difference between the probe and the vector average of the set of reference color signals, then the calculated value of the metric may be compared to a predetermined value, and if it is less than the value it may be determined that the measured color signal indicates a seed layer is present on the test wafer. As indicated above, the threshold value may be indicative of, e.g. be a multiple of, the average deviation associated with the vector average. It is noted, that in the context of this disclosure, the average deviation associated with the vector average of a set of several reference color signals having multiple color components is given by:

$$\sigma = \frac{1}{n} \sum_{k=1}^{n} |c(\text{reference } k) - c(avg)|$$

where $$|c(\text{reference } k) - c(avg)| = \sqrt{\sum_{i=1}^{N} \left\{ c_i(\text{reference } k) - \frac{1}{n} \sum_{j=1}^{N} c_i(\text{reference } j) \right\}^2}$$

(as is readily appreciated by one having ordinary skill in the art) with | . . . | thereby designating the vector norm.

If the approximate thickness of a reference wafer's seed layer is known, then a measured probe color signal's similarity to a color signal measure from the reference wafer may be used to gauge the approximate thickness of the test wafer's seed layer. For instance, if a comparison metric indicates that the probe signal is sufficiently similar to a set of color signals measured from a set of reference wafers of known thicknesses, then it may be inferred that the test wafer's seed layer is approximately the same thickness as that of the average of that set of reference wafers. However, if there are multiple sets of reference color signals available for comparison, each measured from a different set of reference wafers having seed layers of approximately the same thicknesses within a set, but having different thicknesses going from set to set, then this additional information may be analyzed and exploited to better estimate the approximate seed layer thickness on the test wafer. Thus, for example, to exploit this information, a wafer seed layer thickness determination methodology may include calculating the value of additional metrics indicative of the differences between the probe color signal measured off the test wafer and the probe color signals measured off each set of reference wafers having seed layers of known thicknesses. As described above, a monotonic function of the magnitude of the vector difference between the components of the probe color signal and the vector average of the components of color signals within each set of reference color signals may be used as the functional form of these different metrics corresponding to the different reference wafers. After they are computed, the metrics associated with the comparison between the probe color signal and each set of reference wafers (of particular mean thicknesses) may be analyzed to develop an estimate of the approximate thickness of the seed layer on the test wafer.

Many approaches may be employed for performing this multi-reference wafer based thickness determination analysis. One method is to review the values of all the metrics which indicate the differences between the probe color signal and the sets of reference color signals, and to identify from these values which set of reference wafers have a measured color signal closest to the color signal measured from the test wafer. Or, more specifically, within some statistical variation associated with a particular set of reference wafers. Of course, in some embodiments, a set of reference color signals may consist of just a single color signal measured from a single reference wafer of known thickness, and therefore just a comparison with this reference signal would be used to determine similarity to this reference set. In any event, the test wafer's seed layer thickness may be determined based on the aforementioned comparison metrics to be approximately equal to the mean thicknesses of the seed layers of the set of reference wafers which are judged most similar. More complicated approaches may also be employed however. For instance, multiple sets of color signals measured from multiple sets of reference wafers having known seed layer thicknesses may be used to develop a functional relationship between color signal and seed layer thickness, and this relationship may be used to estimate the seed layer thickness of the test wafer based on the color signal measured from its surface. This functional relationship between seed thickness and color signal could be linear, or roughly linear, or nonlinear, depending on the scenario. The functional relationship will never be exact, of course, but a best fit functional relationship may be selected or determined from one or more trial functional forms fit to a given set of data (i.e. color signal measurements from reference wafers of known seed layer thicknesses). The best fit will presumably establish values for one or more parameters associated with the functional form as is readily appreciated by one having skill in the art (e.g., the slope and intercept of a line if the functional relationship is assumed to be linear). Of course, as will also be appreciated by one having ordinary skill in the art, once a functional relationship between color signal and seed thickness is determined (whether it be linear, non-linear, etc.), the function may be applied to a measured color signal via analytic function evaluation, look-up table, etc. to calculate an approximate seed layer thickness. Development of a function which relates seed layer thickness to measured color signal allows the determination of approximate seed thicknesses which are in between the seed thickness values exhibited in the sets of reference wafers. Thus, the embodiments just described rely on the use of one or more sets of reference color signals potentially measured from one or more sets of reference wafers and potentially stored thereafter as a basis for comparison with the color signal measured from a point on the test wafer.

A wafer whose seed layer may be detected by the methods disclosed herein—and, in some embodiments, have the thickness of this seed layer approximately determined—is schematically illustrated in FIG. 1. FIG. 1 schematically illustrates the top surface of a typical test wafer 100 having an interior "active circuit" region 102 and an edge region 103, located between the edge of the wafer 101 and the interior region 102.

Since, deposition (typically via PVD) of the seed layer—to be electroplated upon in subsequent electroplating operations—is typically more uniform in the interior region 102 of the wafer than in the edge region 103, in some embodiments, the probe color signal is measured from a point within this interior region 103, so as to provide a reliable value(s) for comparison with the stored reference color signal(s). However, in some embodiments, measurement of a probe color signal at a point within the edge region of the wafer being tested may provide an additional benefit. This is because if the color signal measured from the edge region is substantially different from those in a reference set (also measured from the edge region of properly seeded wafers), it may indicate that edge bevel removal (EBR) has already been performed on this particular wafer, and due to the fact that EBR is typically performed after electroplating, this may provide an indication that the particular wafer has already been electroplated and is therefore unsuitable for electroplating, despite the fact that from a technical standpoint a seed layer is present underneath the electroplated layer. As a result, probe signal measurement within the edge region may be an effective way to prevent any duplicative electroplating operation (and duplicative EBR operation) which would likely render a wafer unsuitable for further processing.

Figure 2:
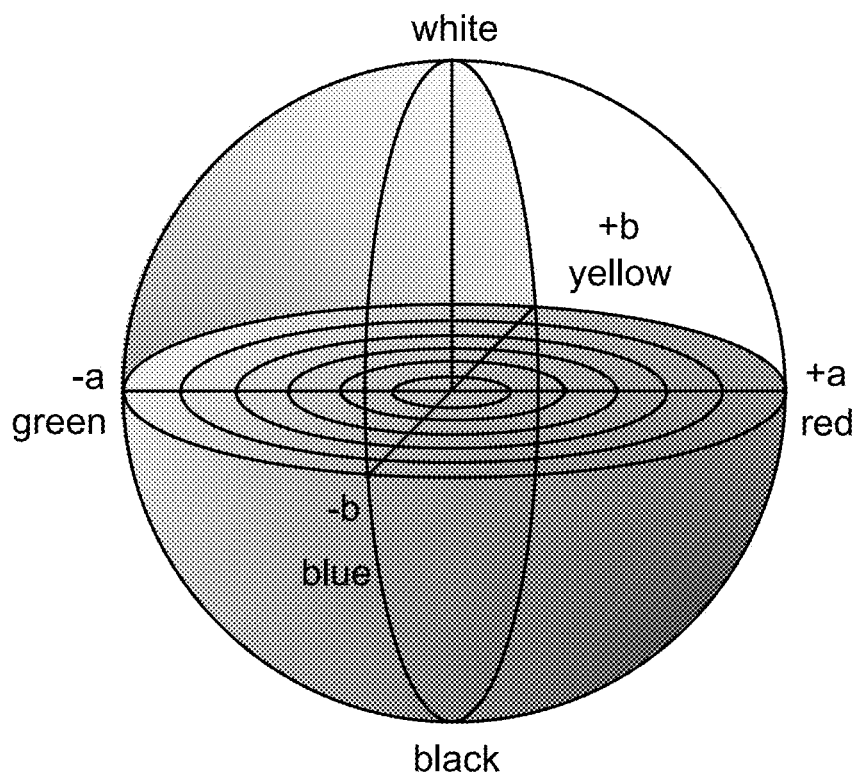
FIG. 2 schematically illustrates a three color component color space using "a", "b", and "L*" color components.
Figure 3A:
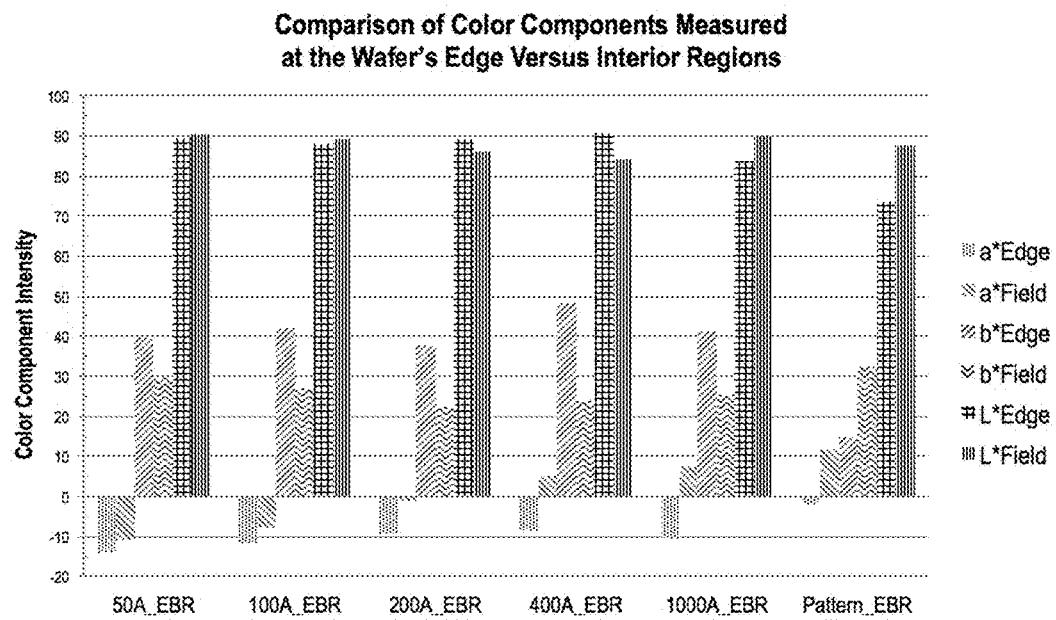
FIG. 3A illustrates the results of color signal measurement tests performed on 6 wafers having seed layers of differing thicknesses present on their surfaces, with measurements taken within the interior regions and edge regions of the 6 wafers.
Figure 3B:
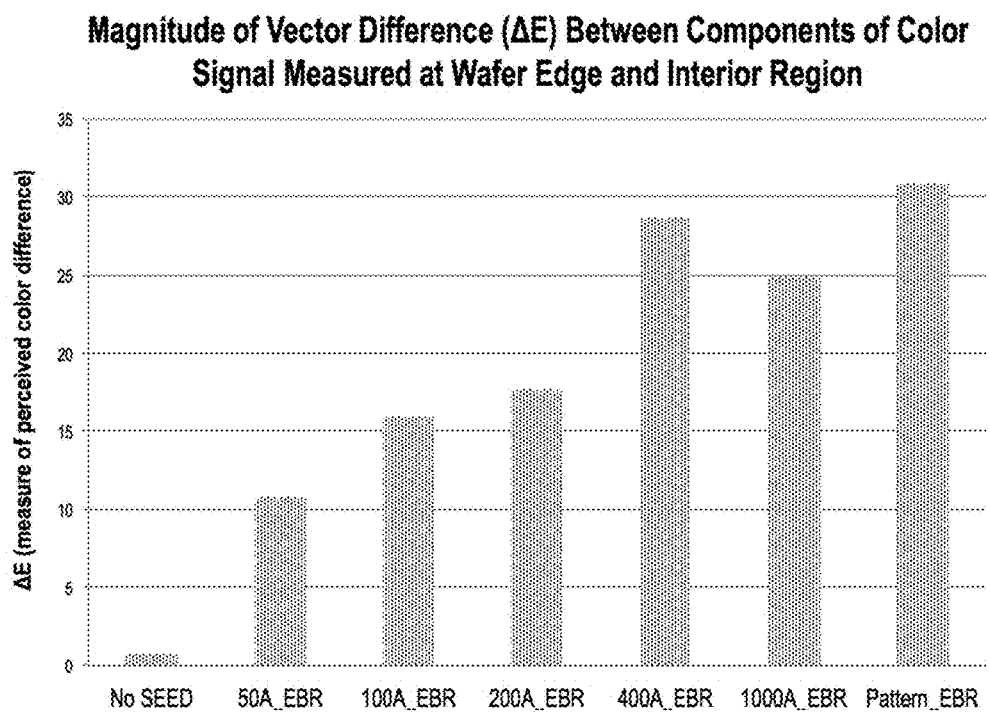
FIG. 3B plots the vector difference of the individual color components plotted in FIG. 3A for the 6 wafers.

In order to illustrate the feasibility of using one or more color signal components to detect seed layer presence and/or measure seed layer thickness from the surface of a semiconductor wafer, data from a test example is exhibited in FIGS. 3A and 3B. The color signal measured in these tests consisted of three color components labeled "a*", "b*", and "L*" in FIG. 3A. This particular representation of color space is schematically illustrated in FIG. 2. As shown in FIG. 2, the "a*" color component indicates the relative proportion of green to red in the color signal, the "b*" color component indicates the relative proportion of blue to yellow in the color signal, and the "L*" color component is indicative of the overall luminosity or brightness of the color signal. Of course, while a value of (a*,b*,L*) designates a position in this particular color space, one of ordinary skill in the art will recognize that other representations of color space are also feasible, and that the actual physical color designated by a particular (a*,b*,L*) triplet in this color space will be potentially designated by a different triplet value of color components in a different color space. Moreover, one of ordinary skill in the art will readily appreciate that the inventive concepts disclosed herein are not restricted to this particular representation of color space in terms of a*,b*, and L* components.

Returning to FIG. 3A, as shown in the figure, color signals were measured at points within the interior regions and edge regions of 6 wafers having seed layers of differing thicknesses present on their surfaces. A portion of the seed layer on each wafer was removed near its edge region thereby setting up a scenario where deposited seed layer was present within the interior regions of the wafers but absent within the edge regions. This provided a test vehicle for evaluating the sensitivity of measured color signals to various seed layer thicknesses, to assess color differentiation based on seed layer thickness, etc. The designation "50A_EBR" in FIG. 3A indicates the tested wafer's surface had a 50 angstrom seed layer present, the "100A_EBR" designation, a 100 angstrom seed layer present, and so forth. For each wafer, the data plotted in FIG. 3A consists of three color signal components (a*,b*,L*) measured from that particular wafer's edge region and another three color components (a*,b*,L*) measured from that particular wafer's interior region (labeled "Field" in FIG. 3A's legend).

The variation in measured color component intensities (a*,b*,L*) over the various wafers shown in FIGS. 3A and B illustrates the feasibility of using color component analysis to detect seed layer presence and also, in some embodiments, to estimate its thickness. For instance, the a* and b* color components show a significant difference between edge and interior regions, even at 50 and 100 angstroms, and furthermore this edge-to-interior difference between individual a* and b* color components is seen to generally increase with increasing seed layer thickness. Thus, in some embodiments, the methods and apparatuses disclosed herein may be used to detect an acceptable copper seed layer having a thickness of less than about 200 angstroms, and in certain such embodiments, an acceptable copper seed layer having a thickness of between about 50 and 150 angstroms.

Use of color difference to detect seed layer presence and/or thickness is further illustrated in FIG. 3B. To be precise, FIG. 3B plots the magnitude of the vector difference, ΔE, between the three color components measured within each wafer's interior region and the three color components measured within each wafer's edge region. I.e., FIG. 3B plots the vector difference, ΔE, of the individual a*, b*, L* color components plotted in FIG. 3A. FIG. 3B shows that as seed layer thickness is increased, the color difference, ΔE, between the wafer edge where no seed is present and interior regions also increases, in a roughly linear fashion. (It is noted that although the bar on the plot corresponding to the wafer with the 1000 angstrom seed layer shows some deviation from the linear relationship exhibited by the other measured wafers, this is thought to be due to challenges associated with the thicker 1000 angstrom seed layer in etching away copper from the wafer's edge, which resulted in a smaller edge region and more difficulty in positioning the probe for color signal measurement. This is because the etchant spends more time reacting to the increased levels of copper it encounters on the thicker seed edges.)

In any event, of significance in FIG. 3B is the fact that there is a significant measurable color difference (ΔE) between the edge and interior regions of a wafer having only 50 angstroms of seed present, in contrast to the nearly zero color difference (ΔE) corresponding to the wafer with no seed present (see leftmost bar on FIG. 3B). The nearly zero color difference (ΔE) for this wafer with no seed present demonstrates the sensitivity of the color signal differencing technique and its reliability at discerning no color difference when none exists. Prior methods of in situ seed layer detection operated by comparing a grayscale intensity measured from a point within the wafer's interior region to a grayscale intensity measured from a reference target set up in the processing chamber. These prior methodologies were typically unable to reliably detect seed layers having thicknesses less than 200 angstroms. FIG. 3B demonstrates that by using the methodologies disclosed herein, thin seed layers of thickness below 200 angstroms can be unambiguously detected, and in some embodiments, seed layers which are only 50 angstroms thick can be accurately detected. In fact, the data suggests that, in some embodiments, it is likely feasible to detect copper seed layers which are less than 25 angstroms thick or even down to about 10 angstroms thick (although this experiment has not been carried out here). Thus, in some embodiments, the methods and apparatuses disclosed herein may use ΔE to detect the presence or absence of a acceptable thin copper seed layer having a thickness of less than about 50 angstroms, or less than about 25 angstroms, or even less than about 10 angstroms.

Another important aspect of the present disclosure illustrated by FIG. 3A relates to the selection of color components for use in a wafer seed layer detection and/or thickness determination methodology. The vector differences plotted in FIG. 3B were calculated using all three of the color components (a*,b*,L*) plotted in FIG. 3B, however 3A illustrates that not all color components are equally useful.

For instance, the variation (between edge and interior) in the L* component is only very slight for wafers having seed layers of 200 angstrom thickness and below. It is therefore thought that the L* color component is generally less suitable for color difference-based detection techniques than the a* and b* color components. Since the L* component represents the luminosity or overall brightness of the color signal, this may account for the difficulty of the standard grayscale seed detection methodology to identify the presence or absence of seed layers less than 200 angstroms thick.

Thus, one optimization apparent from FIG. 3A is to only use the a* and b* color components to calculate the color difference ΔE, and an additional optimization would be to not measure the L* component at all. Going a step further, certain method embodiments may only analyze a single color component of a multi-component color signal, or similarly, may analyze a color signal which consists of only a single color component. In the case of FIGS. 3A and 3B, this could mean selecting either the a* or b* color component depending on which one shows the largest variation over various seed layer thicknesses. In this regard, FIG. 3A seems to indicate that b* would be the superior choice if only one color component was to be used. As indicated above, if the color difference ΔE is calculated based upon a single color component, then the equation for ΔE shown above reduces simply to the absolute value of the difference between the one color component of the probe and the average of that color component over the set of reference color signals:

$$\Delta E = \left| c_i(\text{probe}) - \frac{1}{n}\sum_{j=1}^{n} c_1(\text{reference } j) \right|$$

where "reference," once again, could refer to a stored color signal and/or a color signal measured contemporaneously on a reference wafer. Thus, in this disclosure, calculation of ΔE via the magnitude of the vector difference between the color components of a measured color signal and the average of a set of reference color signals is intended to include the case where each color signal contains a single color component and the formula reduces to the absolute value of the difference between the two terms.

Accordingly, methods and apparatuses disclosed herein for determining the presence and/or approximate thickness of a seed layer on a semiconductor wafer may measure color signals—from wafer surfaces—having single (first) color components, two (first and second) color components, or three (first, second, and third) color components. Metrics may be calculated which are indicative of the differences between these color signals—whether having one, two, or three color components—and the presence or absence of a seed layer and optionally its thickness may be estimated based on the value of these metrics. It is also feasible in principle to use more than three color components, such as 4, 5, 6, 7, 8, 9, 10, or 16 color components in the measurements and analysis, or a number of color components in a range spanning 8 to 16 color components, or 16 to 32 color components, or 32 to 64 color components, or 64 to 128 color components, or 128 to 256 color components. If 3 or less color components are used, these color components may be chosen to be any combination of the *a, *b, or *L color components illustrated schematically in FIG. 2 and measured and plotted for the test wafers in FIG. 3A, or a combination of other types of color components (whether one, two, three) such as, for example, RGB (red, green, blue) color components.

Finally, it should also be noted that although it is generally the case that the probe and reference color signals would include the same type and number of color components, it is not necessarily required. A metric indicative of the difference between the two color signals (or between a measured signal and a vector average) having different numbers of color components could still be computed by ignoring the extra color components, for example. In yet other embodiments, the components of the probe color signal may represent different color space components than the components of the one or more reference color signals. If this is the case, various color space vector projection methods may be used to still formulate a meaningful comparison metric.

Electroplating Systems with Integrated Seed Layer Analysis Systems and Color Sensors For the reasons described above, it is advantageous for an electroplating apparatus to have the capability of determining whether a wafer designated for electroplating in fact has the requisite seed layer present on its surface prior to initiating an electroplating operation. Accordingly, disclosed herein are electroplating modules and systems having seed layer analysis systems which implement the methods of seed layer presence detection and optional thickness determination disclosed in the previous section. However, since these apparatuses are first and foremost devices for performing electroplating operations, the general characteristics of these devices relating to their electroplating function will be described first. For instance, one example of an electroplating system which may potentially benefit from integration of such a seed layer analysis system is the SABRE™ system available from Lam Research Corp., aspects of which are described in U.S. Pat. No. 6,156,167, "CLAMSHELL APPARATUS FOR ELECTROCHEMICALLY TREATING SEMICONDUCTOR WAFERS," which is hereby incorporated by reference herein in its entirety for all purposes.

Figure 4:
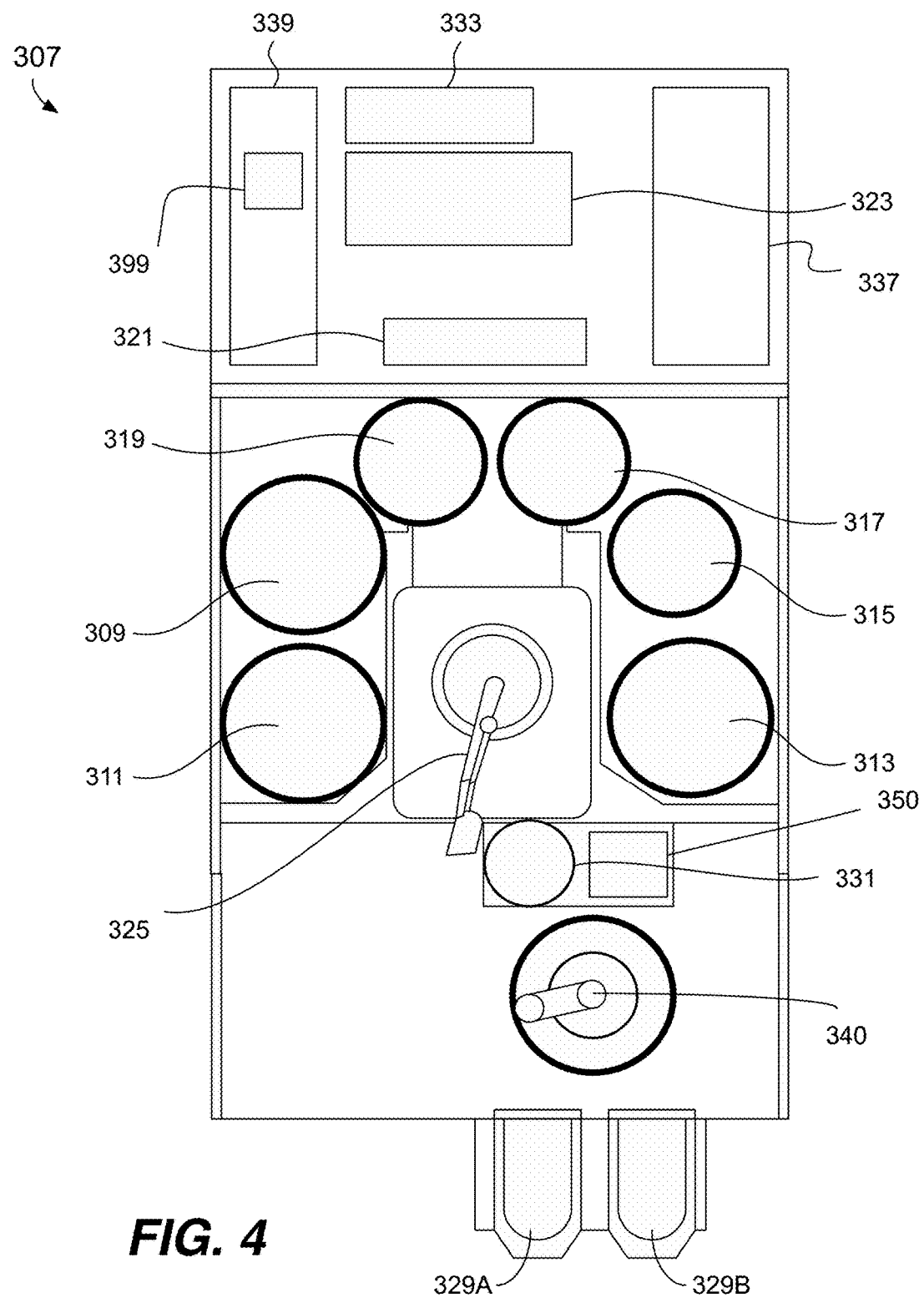
FIG. 4 schematically illustrates an electroplating system which includes multiple electroplating modules.
Figure 5:
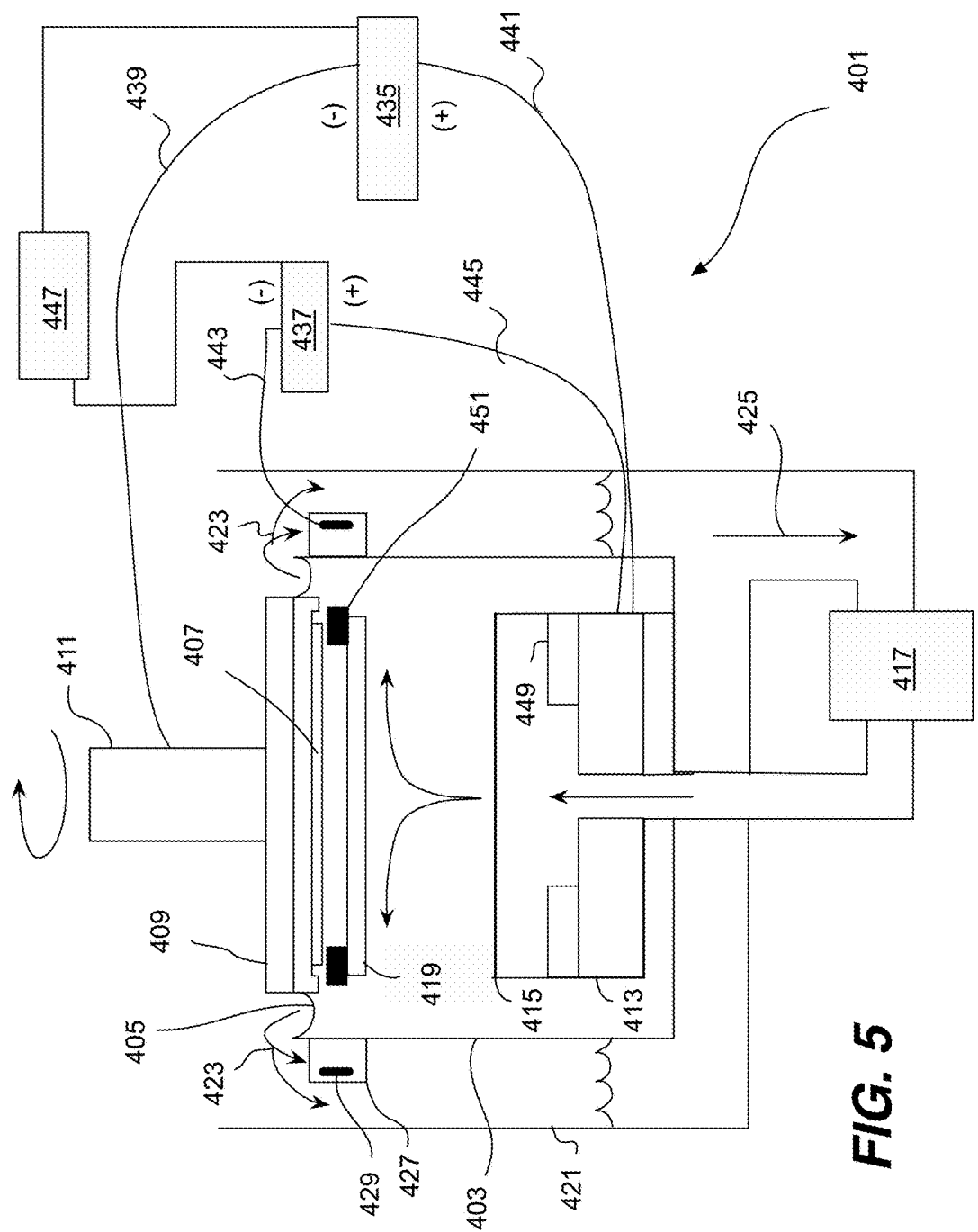
FIG. 5 schematically and cross-sectionally illustrates an electroplating module which could serve as an electroplating module within the electroplating system exhibited in FIG. 4.

Thus, In order to facilitate understanding of the various concepts disclosed herein, FIGS. 4 and 5 and accompanying written description present the specific details of one electroplating system embodiment, as well as an electroplating module which may be employed within the system, and also a brief description of associated electroplating operations. While the figures and accompanying written description are presented in order to provide a concrete illustration of the inventive concepts disclosed herein, they are, of course, not to be construed as limiting those inventive concepts to these specific embodiments.

Electroplating Systems

FIG. 4 schematically illustrates an electroplating system 307 which may include multiple electroplating modules, in this case the three separate modules 309, 311, and 313. As described more fully below, each electroplating module typically includes a cell for containing an anode and an electroplating solution during electroplating, and a wafer holder for holding the wafer in the electroplating solution and rotating the wafer during electroplating. The electroplating system 307 shown in FIG. 4 further includes three separate post-electrofill modules (PEMs) 315, 317 and 319. Depending on the embodiment, each of these may be employed to perform any of the following functions: edge bevel removal (EBR), backside etching, and acid cleaning of wafers after they have been electrofilled by one of modules 309, 311, and 313. Note that a post-electrofill module (PEM) which performs edge bevel removal (EBR) will alternatively be referred to herein simply as an EBR module. Electroplating system 307 may also includes a chemical dilution module 321 and a central electrofill bath 323. The latter may be a tank that holds the chemical solution used as the electroplating bath in the electrofill modules. Electroplating system 307 may also include a dosing system 333 that stores and delivers chemical additives for the plating bath. If present, the chemical dilution module 321 may store and mix chemicals to be used as the etchant in the post electrofill modules. In some embodiments, a filtration and pumping unit 337 filters the plating solution for central bath 323 and pumps it to the electrofill modules.

Finally, in some embodiments, an electronics unit 339 may serve as a system controller providing the electronic and interface controls required to operate electroplating system 307. The system controller typically includes one or more memory devices and one or more processors configured to execute instructions so that the electroplating system can perform its intended process operations. Machine-readable media containing instructions for controlling process operations in accordance with the implementations described herein may be coupled to the system controller. Unit 339 may also provide a power supply for the system.

In operation, a robotic wafer transfer mechanism may be used for transferring wafers to and from one or more wafer storage devices, one or more electroplating modules, and one or more seed layer analysis systems (although, it is noted that in some embodiments, a seed layer analysis system may analyze wafers while held in the wafer holder of an electroplating module). For example, referring again to FIG. 4, a robot including a back-end robot arm 325 may be used to select wafers from a wafer cassette, such as a cassette 329A or 329B, which serve as wafer storage devices for storing, loading, and unloading wafers. Back-end robot arm 325 may attach to the wafer using a vacuum attachment or some other feasible attaching mechanism.

A front-end robot arm 340 may select a wafer from a wafer cassette such as the cassette 329A or the cassette 329B. The cassettes 329A or 329B may be front opening unified pods (FOUPs). A FOUP is an enclosure designed to hold wafers securely and safely in a controlled environment and to allow the wafers to be removed for processing or measurement by tools equipped with appropriate load ports and robotic handling systems. The front-end robot arm 340 may hold the wafer using a vacuum attachment or some other attaching mechanism. The front-end robot arm 340 may interface with the cassettes 329A or 329B, a transfer station 350, or an aligner 331. From the transfer station 350, back-end robot arm 325 may gain access to the wafer. The transfer station 350 may be a slot or a position to and from which front-end robot arm 340 and back-end robot arm 325 may pass wafers without going through the aligner 331. In some implementations, however, to ensure that a wafer is properly aligned on the back-end-robot 325 for precision delivery to an electroplating module, the back-end robot arm 325 may align the wafer with aligner 331. Back-end robot arm 325 may also deliver a wafer to one of the electrofill modules 309, 311, or 313 or to one of the three post-electrofill modules 315, 317, and 319.

In situations where the aligner module 331 is to be used to ensure that the wafer is properly aligned on back-end robot arm 325 for precision delivery to an either an electroplating module 309, 311, or 313, or an EBR module 315, 317, and 319 (assuming these PEMs perform EBR), back-end robot arm 325 transports the wafer to aligner module 331. In certain embodiments, aligner module 331 includes alignment arms against which back-end robot arm 325 pushes the wafer. When the wafer is properly aligned against the alignment arms, the back-end robot arm 325 moves to a preset position with respect to the alignment arms. In other embodiments, the aligner module 331 determines the wafer center so that the back-end robot arm 325 picks up the wafer from the new position. It then reattaches to the wafer and delivers it to one of the electroplating modules 309, 311, or 313, or EBR modules 315, 317, and 319.

Thus, in a typical operation of forming a layer of metal on a wafer using the electroplating system 307, back-end robot arm 325 transports a wafer from wafer cassette 329A or 329B to aligner module 331 for pre-electroplating centering adjustment, then to electroplating module 309, 311, or 313 for electroplating, then back to aligner module 331 for pre-EBR centering adjustment, and then to EBR module 315, 317, or 319 for edge bevel removal. Of course, in some embodiments, a centering/alignment step may be omitted if realignment of the wafer is typically not necessary.

As described more fully below, the electroplating operation may involve loading the wafer in a clamshell type wafer holder and lowering the clamshell into an electroplating bath contained within a cell of one of electroplating modules 309, 311, or 313 where the electroplating is to take place. The cell oftentimes contains an anode which serves as a source of the metal to be plated (although the anode may be remote), as well as an electroplating bath solution oftentimes supplied by the central electrofill bath reservoir 323 along with optional chemical additives from a dosing system 333. The EBR operation subsequent to the electroplating operation typically involves removing unwanted electroplated metal from the edge bevel region and possibly the backside of the wafer by way of applying an etchant solution which is provided by chemical dilution module 321. After EBR, the wafer is typically cleaned, rinsed, and dried.

Finally, it is noted that after post-electrofill processing is complete, back-end robot arm 325 may retrieve the wafer from the EBR module and returns it to cassette 329A or 329B. From there the cassettes 329A or 329B may be provided to other semiconductor wafer processing systems such as a chemical mechanical polishing system, for example.

Electroplating Modules

A specific embodiment of an electroplating module—where the actual operation of electroplating is performed—is schematically and cross-sectionally illustrated in FIG. 5. Such an embodiment could serve as any of electroplating system 307's electroplating modules 309, 311, and/or 313 as described above and shown in FIG. 4. Referring again to FIG. 5, the illustrated electroplating module 401 includes an electroplating cell 403 that contains the electroplating solution and an anode during electroplating, which is shown at a level 405. A wafer 407 may be immersed in the electroplating solution while held by a "clamshell" holding fixture 409, the clamshell mounted on a rotatable spindle 411. The rotatable spindle allows for rotation of clamshell 409 together with the wafer 407. Once again, the SABRE™ system available from Lam Research Corp., aspects of which are described in U.S. Pat. No. 6,156,167, incorporates a clamshell-type electroplating apparatus. Aspects of clamshell-type electroplating apparatuses are further described in U.S. Pat. No. 6,800,187. Both of the foregoing patents are hereby incorporated by reference in their entirety for all purposes. Of course, wafer holders other than clamshell-type fixtures may alternatively be employed.

The anode 413 is disposed below the wafer 407 within the electroplating cell 403 and is separated from the wafer region by an anode membrane 415, which is an ion selective membrane in some implementations. The region below the anode membrane is often referred to as an "anodic region" or as an "anode chamber" and electrolyte within this chamber as "anolyte," while the region above the anode membrane is often referred to as a "cathodic region" or as a "cathode chamber" and the electrolyte within this chamber as "catholyte." The anode membrane 415 allows ionic communication between the anodic and cathodic regions of the electroplating cell, while preventing any particles generated at the anode from entering the proximity of the wafer and contaminating it. The anode membrane may also be useful in redistributing current flow during the electroplating processes and thereby improve electroplating uniformity. Anode membranes are further described in U.S. Pat. No. 6,126,798 and U.S. Pat. No. 6,569,299, both of which are hereby incorporated by reference.

The electroplating solution may be continuously provided to electroplating cell 403 by a pump 417. Generally, the electroplating solution flows upwards through an anode membrane 415 and a resistive element 419 to the center of wafer 407 and then radially outward and across the wafer. In some implementations, the electroplating solution may be provided into the anodic region of the electroplating cell 403 from the side of the electroplating cell. In some implementations, the electroplating solution may be supplied through separate inlets into anodic and cathodic regions of the electroplating cell 403.

The resistive element 419 is located in close proximity of the wafer (within about 10 millimeters or between about 3 to 8 millimeters, in various embodiments) and serves as a constant current source to the wafer. That is, the resistive element 419 shapes the electrolyte current near the wafer to provide a relatively uniform current distribution over the wafer surface. The element contains a plurality of one-dimensional through holes, as described further below. Further details regarding resistive elements may be found in U.S. patent application Ser. No. 12/291,356, titled "METHOD AND APPARATUS FOR ELECTROPLATING," and filed Nov. 7, 2008, which is hereby incorporated by reference.

After the electroplating solution flows across the surface of the wafer, some of the solution may overflow the electroplating cell 403 to an overflow reservoir 421, as indicated by arrows 423. The electroplating solution may be filtered (not shown) and returned to pump 417, as indicated by arrow 425, completing the recirculation of the electroplating solution.

In some embodiments, such as that shown in FIG. 4, an electroplating module may employ a second cathode chamber 427 containing a second cathode 429 (i.e., a thief cathode) which may be located on the outside of the electroplating cell 403 and peripheral to the wafer 407. Generally, the second cathode 429 may be positioned at a number of locations within the electroplating cell or outside the electroplating cell. In some embodiments, the electroplating solution overflows a weir wall of the electroplating cell 403 into the second cathode chamber 427. In some embodiments, the second cathode chamber 427 is separated from the electroplating cell 403 by a wall having multiple openings covered by an ion-permeable membrane. The membrane allows ionic communication between the electroplating cell 403 and the second cathode chamber 427, thereby allowing current to be diverted to the second cathode. The use of the second cathode 429 can substantially reduce center-to-edge non-uniformity which typically results from terminal and field effects. A second cathode may be used either alone or in combination with further auxiliary cathodes or with a variety of fixed or dynamic shields. Further details regarding auxiliary cathodes, including secondary and tertiary cathodes, can be found in U.S. patent application Ser. No. 12/481,503, titled "METHOD AND APPARATUS FOR ELECTROPLATING," and filed Jun. 9, 2009, which is hereby incorporated by reference. It should be understood that the secondary/auxiliary cathode and its associated power supply/supplies as well as any other associated hardware elements are optional features of an electroplating module.

During electroplating, of course, current is supplied to the wafer surface so that the electrochemical reduction of whatever metal is being plated (e.g., $Cu^{2+}+2e^-\rightarrow Cu$) may occur. Thus, two DC power supplies 435 and 437 can be used to control current flow to the wafer 407 and to the second cathode 429, respectively. A power supply 435 has a negative output lead 439 electrically connected to the wafer 407 through one or more slip rings, brushes, or contacts (not shown). The positive output lead 441 of the power supply 435 is electrically connected to the anode 413 located in electroplating cell 403. The power supply may have an output voltage of up to about 250 volts, for example. Similarly, a power supply 437 has a negative output lead 443 electrically connected to the second cathode 429, and a positive output lead 445 electrically connected to the anode 413. Alternatively, one power supply with multiple independently controllable electrical outlets can be used to provide different levels of current to the wafer and to the second cathode. During use, the power supplies 435 and 437 bias both the wafer 407 and the second cathode 429 to have a negative potential relative to the anode 413. This causes an electrical current flowing from anode 413 to the wafer 407 to be partially or substantially diverted to the second cathode 429. The electrical circuit described above may also include one or several diodes that will prevent reversal of the current flow, when such reversal is not desired. An undesired current feedback may occur during electroplating processes, since the anode 413, which is set at ground potential, is the common element of both the wafer circuit and the second cathode circuit.

The power supplies 435 and 437 may be connected to a controller 447, which allows modulation of current and electrical potential provided to the elements of the electroplating module 401. For example, the controller may allow electroplating either in current-controlled or potential-controlled regimes. The controller 447 may include program instructions specifying current and voltage levels that need to be applied to various elements of the electroplating module, as well as times at which these levels need to be changed. For example, it may include program instructions for transitioning from potential-control to current-control upon immersion of the wafer into the electroplating solution. In embodiments lacking a second cathode chamber and thief cathode, a single power supply may be used to supply and control current flow to the wafer 407 during electroplating.

Another optional features of an electroplating module are one or more shields, such as shield 449, which can be positioned within the electroplating cell 403 between the resistive element 419 and the anode 413 (e.g., below the resistive element in wafer-facing-down systems). The shields are usually ring-shaped dielectric inserts, which are used for shaping the current profile and improving the uniformity of electroplating, such as those described in U.S. Pat. No. 6,027,631, which is hereby incorporated by reference. However, other shield designs and shapes may be employed as are known to those of skill in the art, such as shields taking the shape of wedges, bars, circles, ellipses, and other geometric designs. Ring-shaped inserts may also have patterns at their inside diameter, which may improve the ability of the shield to shape the current flux in the desired fashion. The function of the shields may differ, depending on their position in the electroplating cell 403. An electroplating module may include a variety of static shields, as well as a variety of variable field shaping elements, such as those described in U.S. Pat. No. 6,402,923 and U.S. Pat. No. 7,070,686, both of which are hereby incorporated by reference. An electroplating module may also include a variety of segmented anodes such as those described in U.S. Pat. No. 6,497,801, or concentric anodes such as those described in U.S. Pat. Nos. 6,755,954 and 6,773, 571, all of which are hereby incorporated by reference. While shielding inserts may be useful for improving electroplating uniformity, they are optional, and alternative shielding configurations may also be employed.

Integrated Seed Layer Analysis Systems and Color Sensors

The electroplating modules and systems described in the previous section may benefit from the integration of a seed layer analysis system capable of determining whether a wafer designated for electroplating has the requisite seed layer present on its surface prior to initiating an electroplating operation. Accordingly, disclosed herein are electroplating systems for electroplating a conductive layer on the surface of a wafer which include an electroplating module, one or more wafer storage devices for storing, loading, and unloading wafers, and a seed layer analysis system for determining the presence and/or thickness of a seed layer. As described above, the electroplating module typically includes a cell for containing an anode and electroplating solution during electroplating, a wafer holder for holding and rotating a wafer during electroplating, and a power supply for supplying current to the wafer during electroplating. The seed layer analysis system may typically include a color sensor for measuring a color signal at a point on the surface of the wafer while held in a wafer holder (of the electroplating system or, in some embodiments, a separate wafer holder associated with the seed layer analysis system), and also color analysis logic for analyzing the measured color signal and determining whether there is a seed layer present on the surface of the wafer.

Figure 6A:
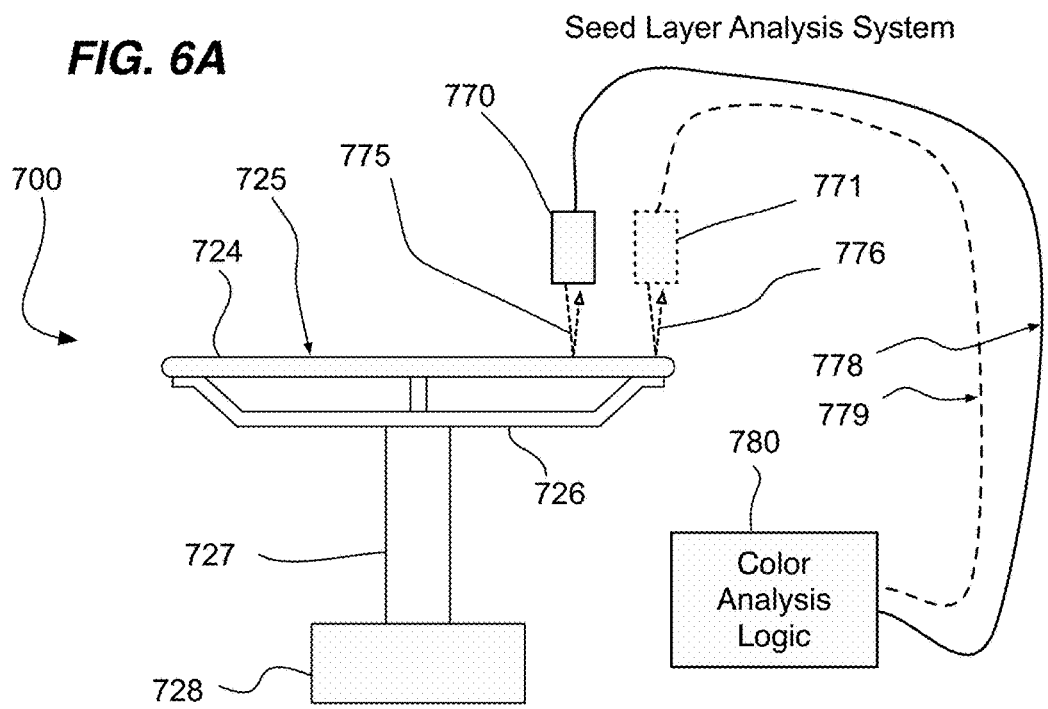
FIG. 6A schematically illustrates a seed layer analysis system having a color sensor, an additional color sensor, and color analysis logic 780.

FIG. 6A provides a basic schematic of a seed layer analysis system 700 having a color sensor 770, an optional additional color sensor 771 (as indicated by dashed lines in the drawing), and color analysis logic 780 electronically connected to color sensor 770 via electrical connection 778 and optionally to color sensor 771 via electrical connection 779 (again, as indicated by the dashed line in the drawing). The color sensor(s) are oriented schematically in the figure to show their relationship to a wafer 724 and wafer holder 726 as they could be oriented within an electroplating system, like electroplating system 307 of FIG. 4. Color sensor 770 is oriented so as to measure a color signal from the interior region of wafer 724's surface 725, as "interior region" is described above, for instance see interior region 102 of wafer 100 in FIG. 1. Likewise, optional color sensor 771 is trained on the edge region of the wafer surface 725, as "edge region" is described above, for instance see edge region 103 of wafer 100 in FIG. 1. Furthermore, since wafer holder 725 is mechanically connected to motor 728 via rotating shaft 727, the wafer may be rotated as desired and color signals may in principle be measured at multiple azimuthally rotated points within the edge and interior regions of the wafer. Multiple measurements within these regions is, of course, not required, but it may provide an opportunity for improved accuracy and precision, particularly for seed layer thickness determinations, in certain embodiments.

The wafer holder is drawn generically in FIG. 6A so as to be consistent with the integration of the seed layer analysis system 700 at a variety of locations within an electroplating system, such as electroplating system 307 of FIG. 4. Possible locations, for example, may include wafer aligner module 331, or any of electroplating modules 309 through 313 shown within electroplating system 307. In some embodiments, an electroplating system may have an integrated physical vapor deposition (PVD) module for deposition a seed layer prior to electroplating, and the wafer seed layer analysis system may be located and configured in the electroplating system such that it can perform seed layer detection after wafers have been processed by the PVD module—since at this point, an acceptable seed layer should be present on the wafer's surface unless something has gone wrong in the PVD process. (Likewise, in some electroplating methods, a wafer is selected for seed layer detection after the wafer has been processed by a physical vapor deposition (PVD) module or tool for depositing a seed layer.)

It should be noted that although wafer holder 726 drawn in FIG. 6A does not specifically resemble the clamshell-type wafer holder oftentimes used to hold a wafer within an electroplating module during electroplating, such use is specifically envisioned and disclosed herein. The wafer holder, of course, will vary depending on the type of processing module or, more generally, the location within the electroplating system designed for integration of a seed layer analysis system. It is further noted with respect to clamshell-type electroplating substrate holders, that these designs oftentimes employ a lipseal element upon which the wafer rests and which specifically contacts the wafer in its edge region. As such, a wafer held in certain clamshell-type wafer holder assemblies may not be able to have color sensor 771 trained at just any point within its edge region, and in some embodiments, no point within the wafer's edge region may be exposed for color signal measurement. Various classes of methodologies for seed layer detection and thickness determination disclosed above do not involve measuring a color signal at a point on the wafer's edge region, and so for these embodiments, obstruction by the lipseal is not an issue, but for those methodologies that do rely on such measurements, it may be possible nevertheless to (i) measure a color from the edge region if some portion of it remains exposed despite the lipseal, or (ii) measure a color signal off the edge region prior to placement of the wafer on the lipseal, either within the electroplating module or at a prior location in the electroplating system.

Of course, as stated above, integration of an additional color sensor 771 is only beneficial in certain cases. As described above, seed layer detection methods may measure a color signal from the edge region of a wafer as well as from the interior region, in some embodiments, because the edge color signal may be useful for verifying that the wafer to be electroplated has not yet been processed by an EBR operation—which likely indicates the wafer has already been electroplated. Note that in some embodiments, which do rely on edge region color signal measurement, color sensor 770 may be physically reoriented so as to be trained on the edge region of the wafer to take this measurement, or alternatively the wafer 724 may be moved so that its edge region is within color sensor 770's line of sight, or yet as another alternative, a combination of sensor and wafer movement may be employed. In such embodiments, the single color sensor 770 may be used for measuring a first color signal at a point within the interior region of the test wafer's surface and also used for measuring a second color signal at a point within the edge region of the test wafer's surface. In practice, the cost of an additional color sensor 771 versus the costs associated with the mechanical hardware necessary to move color sensor 770 and wafer 724 relative to each other will likely be the most important consideration.

As for the color sensor or sensors themselves which are to be used and integrated into an electroplating system as part of a seed layer analysis system, these sensors may be capable of measuring just one color component or they may be capable of measuring multiple color components, depending on the embodiment. In some embodiments, the color sensor employed may be configured to measure three color components, such as the a*, b*, and L* color components described above and schematically illustrated in FIG. 2. In other embodiments, a triplet of RGB (red, green, blue) color components as are typically used in display screens, color cameras, and the like, may serve as the three color components measured by a multi-color-component color sensor. In some embodiments, instead of a color sensor, a color camera directed at a point on the wafer's surface may be employed, although it is oftentimes the case that commercially available color cameras are not as sensitive to slight color differences as commercially available color sensors. Yet, in principle, a color camera may also be effective, depending on the embodiment and the desired sensitivity. Color sensors (and possibly color cameras, as well) may also be capable of measuring more than three color components, and likewise, color sensors (and cameras) may also be designed or configured to measure less than three color components. As an example of the latter, FIG. 3A suggests that a two color component measurement of just the a* and b* color components (leaving out the L* luminosity color component) would be feasible for seed layer detection and optional thickness measurement. And, in some embodiments, a single color component may be sufficient, such as the a* or b* color components of FIG. 3A by themselves.

Figure 6B:
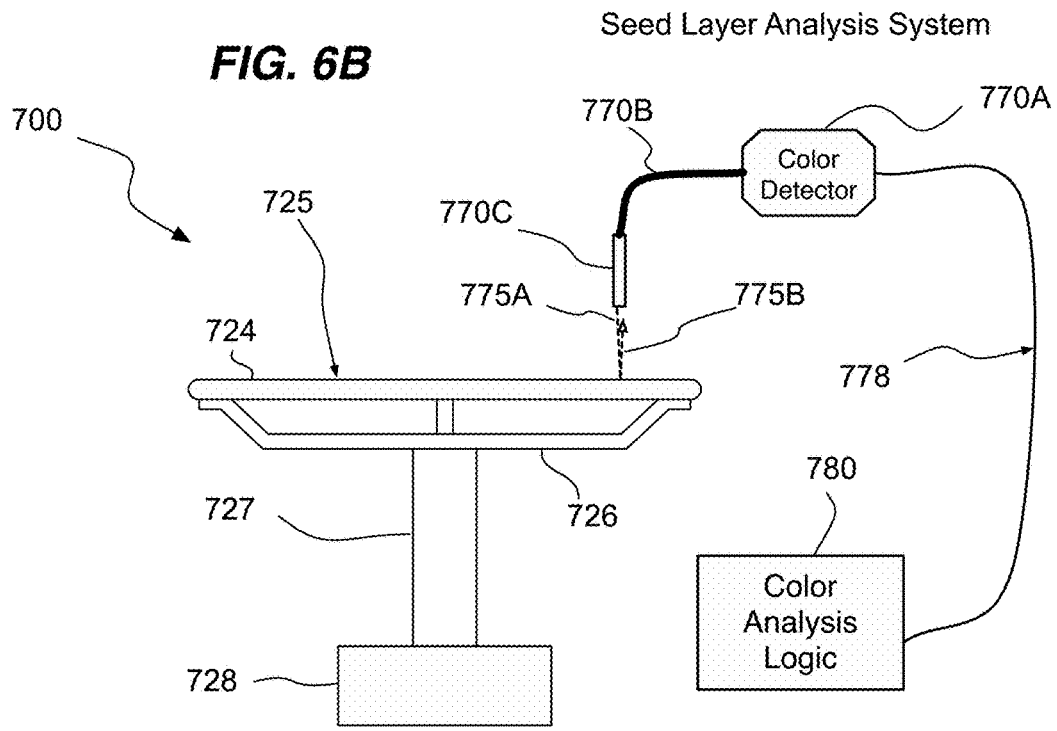
FIG. 6B schematically illustrates another embodiment of a seed layer analysis system.

An example of one suitable color sensor for integration into an electroplating system which measures the three a*, b*, and L* color components illustrated in FIG. 2 is the Micro-Epsilon model color sensor manufactured by Micro-Epsilon of Germany. FIG. 6B illustrates a seed layer analysis system 700 similar to that shown in FIG. 6A, but using a color sensor—collectively, 770A, 770B, 770C—schematically similar in setup to the Micro-Epsilon color sensor. This particular color sensor consists of a main housing 770A, which holds the actual color detection electronics, coupled to at least two fiber optic lines bundled together in a single cable housing 770B which terminates in what can be referred to as a probe housing 770C. During measurement of a color signal from a wafer's surface 725, the probe housing 770C is held in close proximity to the point on the surface to be measured, at an angle of approximately 90 degrees relative to the horizontal plane of the surface, and while one of the at least two fiber optic lines inside cable 770B illuminates the point on the surface to be color sensed with substantially white light 775A, another of the at least two fiber optic lines inside cable 770B carries light reflected 775B from the point on the surface back to the actual electronic color detector located in the color sensor's main housing 770A. Of course, whether the physical configuration of the color sensor 770 is a single physical unit 770 as schematically depicted in FIG. 6A, or whether it includes multiple physical units comprising a main housing 770A, cable housing 770B, and probe housing 770C, as schematically depicted in FIG. 6B, the exact physical configuration is obviously not critical to the operation and functioning of the inventive concepts disclosed herein.

It is noted that color sensor 770 as depicted in FIG. 6A also generates a color signal by measuring light 775 reflected off the wafer surface 725 after the surface is illuminated by a source of illumination within color sensor 770. (And, optional color sensor 771 is depicted as operating similarly with respect to measured light 776.) The light provided by color sensor 770 (and optionally 771) to illuminate the wafer surface 725 for color signal measurement may be characterized as substantially white light (as was indicated above with respect to FIG. 6B), or it may be light of a particular color, e.g. red, or light having intensity restricted to a particular range or ranges of wavelengths. The same is true for the illumination 775A emitted from probe housing 770C as depicted in FIG. 6B. Furthermore, although it is typically the case that a probe color signal and a reference color signal (and/or vector average of reference color signals) to be compared via a comparison metric as discussed above would be generated using illumination of the same character (e.g., red, substantially white, etc.) and of the same intensity, it is not necessarily the case. Thus, for example, in seed layer analysis systems employing a color sensor 770 for interior region color signal measurement and a color sensor 771 for edge region color signal measurement, the illumination used to generate reflected light 775 and 776 may be selected to be of substantially similar character and intensity, or be selected have difference character and/or intensity. Similarly, though a stored reference color signal is generally not measured contemporaneously with the probe color signal, illumination of generally substantially the same character and intensity (e.g. substantially white light of substantially the same intensity) would be used to measure both, in order that meaningful comparisons can easily be made with a suitable comparison metric. Furthermore, in some cases, as described in greater detail below, a measured probe color signal may be subsequently added to a corresponding set of reference color signals, if it is determined that the wafer from which the probe color signal was measured does indeed have an acceptable seed layer present. In this operational setup, since the probe signal may subsequently be treated as a reference signal, it will have been generated using illumination of the same character and intensity.

Once the color signals are generated by color sensors 770 and optionally 771, they are processed by color analysis logic 780 which analyzes the color signals to determine whether an acceptable seed layer is present on the surface of the wafer, and optionally its thickness. Such analysis implemented in the color analysis logic 780 may include any of the analysis methodologies discussed above such as calculation of one or more metrics indicative of the difference between one or more measured probe color signals and one or more corresponding sets of one or more reference color signals, followed by a determination of whether the one or more metrics fall within a predetermined range corresponding to that metric, etc. In some embodiments, the color analysis logic 780 may also include logic for signaling when an acceptable seed layer is not present on a wafer.

FIG. 6A shows that color sensor 770 and optionally 771 are in electronic communication with color analysis logic 780 through electronic connection 778 and optionally 779, respectively; and similarly, the main housing 770A of the color sensor illustrated in FIG. 6B is in electronic communication with color analysis logic 780 through electronic connection 778. Thus, in these sorts of configurations, the color analysis logic is separate from the color sensor(s)—it may, for example, reside on a general purpose computer configured to analyze colors signals using the appropriate color analysis logic after receipt of the color signals from color sensor 770 and/or 771 over a type of serial or parallel electronic communication mechanism (such as a universal serial bus cable). However, in other embodiments, the electronics within a color sensor itself may contain enough processing power to effectively implement the color analysis logic and apply it to the color signals it measures. Thus, for example, color signal processing electronics may be located within the main housing 770A of the color sensor shown in FIG. 6B alongside the color detector electronics.

In yet other embodiments, the electroplating system may employ a main system controller for operating the entire electroplating system, and the color analysis logic may reside on this system controller. Thus, the system controller may be configured to receive color signals from the color sensors and process them. In some embodiments, the system controller may be further configured to prevent the electroplating of a wafer when its color analysis logic determines that the wafer's seed layer is either not present or unsuitable for electroplating, perhaps because its seed layer is of inadequate thickness.

In embodiments where the color analysis logic does not reside on the system controller but is a standalone component or resides on the color sensor itself, the system controller may still be configured to receive signals from the seed layer analysis system and prevent the electroplating of a wafer when the seed layer analysis system signals that the wafer's seed layer is either not present or unsuitable/unacceptable for electroplating. In either case, once a system controller receives a signal that a wafer is not acceptable for electroplating, in some embodiments, the system controller may operate a robotic wafer transfer mechanism to prevent the electroplating of the wafer deemed unacceptable for electroplating. In certain such embodiments, the robotic wafer transfer mechanism may operate to move said unacceptable wafer to a rejected wafer storage area within the system for storing rejected wafers.

Finally, it is to be understood that a seed layer analysis system can also be viewed as a standalone apparatus to be employed in semiconductor fabrication and processing applications for determining whether there is an acceptable seed layer present on the surface of a semiconductor wafer suitable for subsequent electroplating operations. Thus, for example, in some embodiments, a seed layer analysis system for determining the presence of a seed layer on a semiconductor wafer (and optionally its approximate thickness) may be a device which includes a color sensor for measuring one or more probe color signals from the surface of a semiconductor wafer, machine-readable media having data stored thereon representing one or more sets of reference color signals, and color analysis logic which may employ any suitable version of the seed layer detection and/or characterization techniques and methodologies described above. Depending on the embodiment, the color analysis logic may also include logic for signaling, e.g. signaling the controller of an electroplating apparatus, that a wafer is not acceptable for electroplating because an acceptable seed layer is not present.

Additional Methods of Electroplating Employing Seed Layer Detection and/or Thickness Determination Methods Also disclosed herein are methods of electroplating a plurality of wafers from a set of semiconductor wafers which take advantage of the seed layer presence detection techniques disclosed herein. These methods, for example, may be employed in the context of the electroplating apparatuses and seed layer analysis systems described above.

Figure 7A:
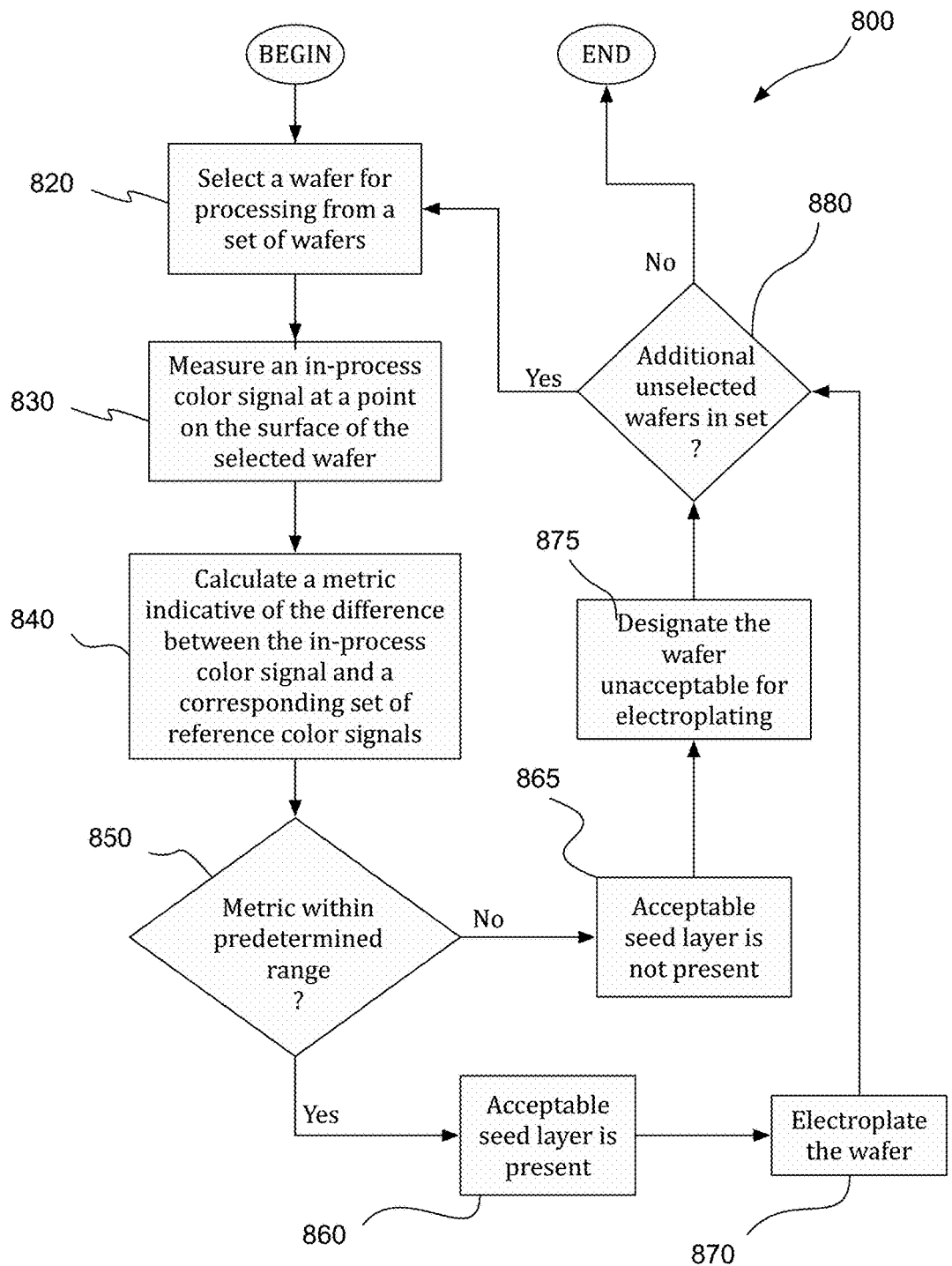
FIG. 7A schematically illustrates methods for electroplating a plurality of wafers from a set of wafers employing a seed layer presence detection technique.
Figure 7B:
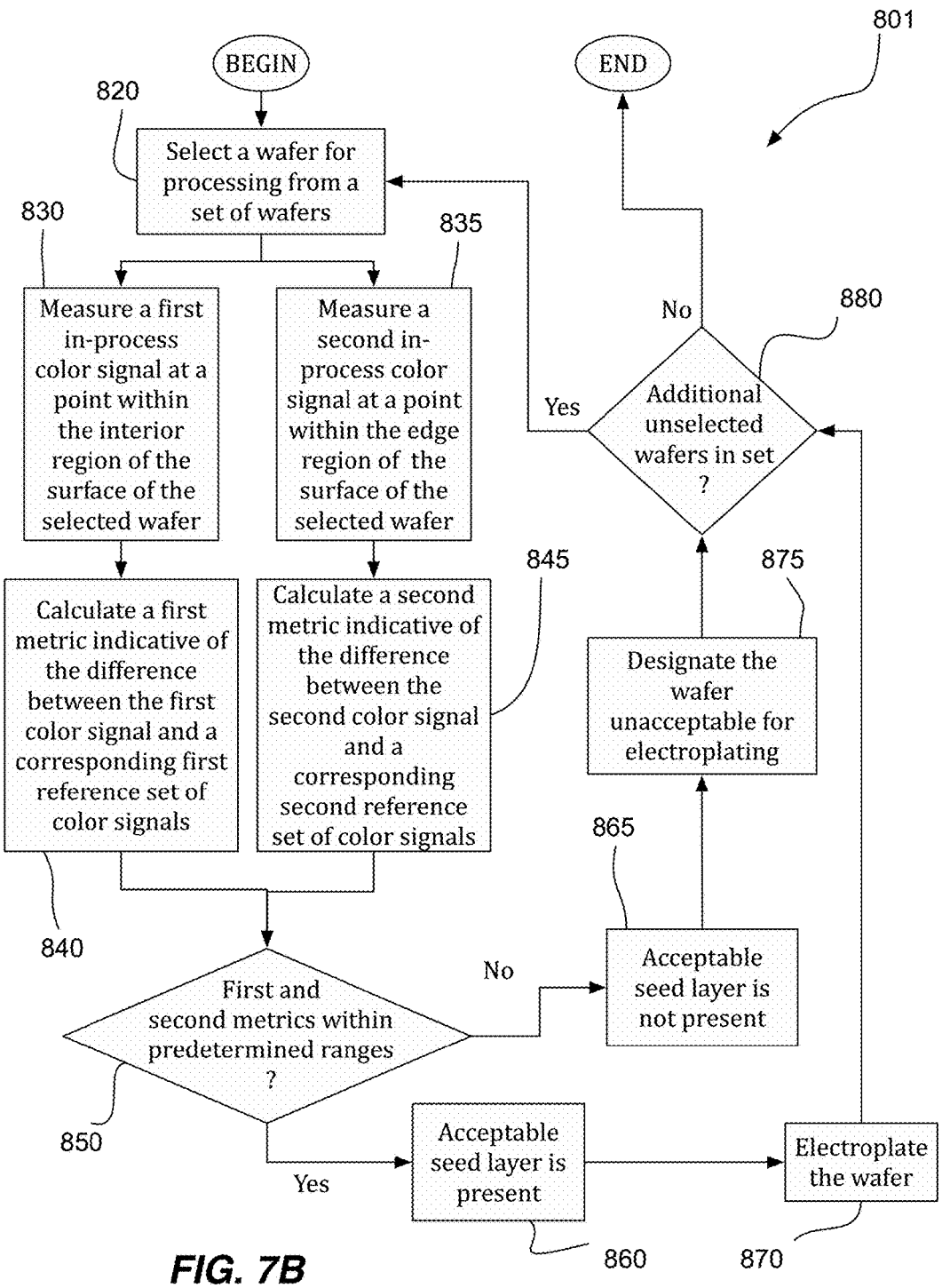
FIG. 7B schematically illustrates electroplating methods which are similar to those presented in FIG. 7A, but specifically illustrates the use of first and second color signals measured at points within the interior and edge regions, respectively, of the surfaces of the wafers being processed.
Figure 8:
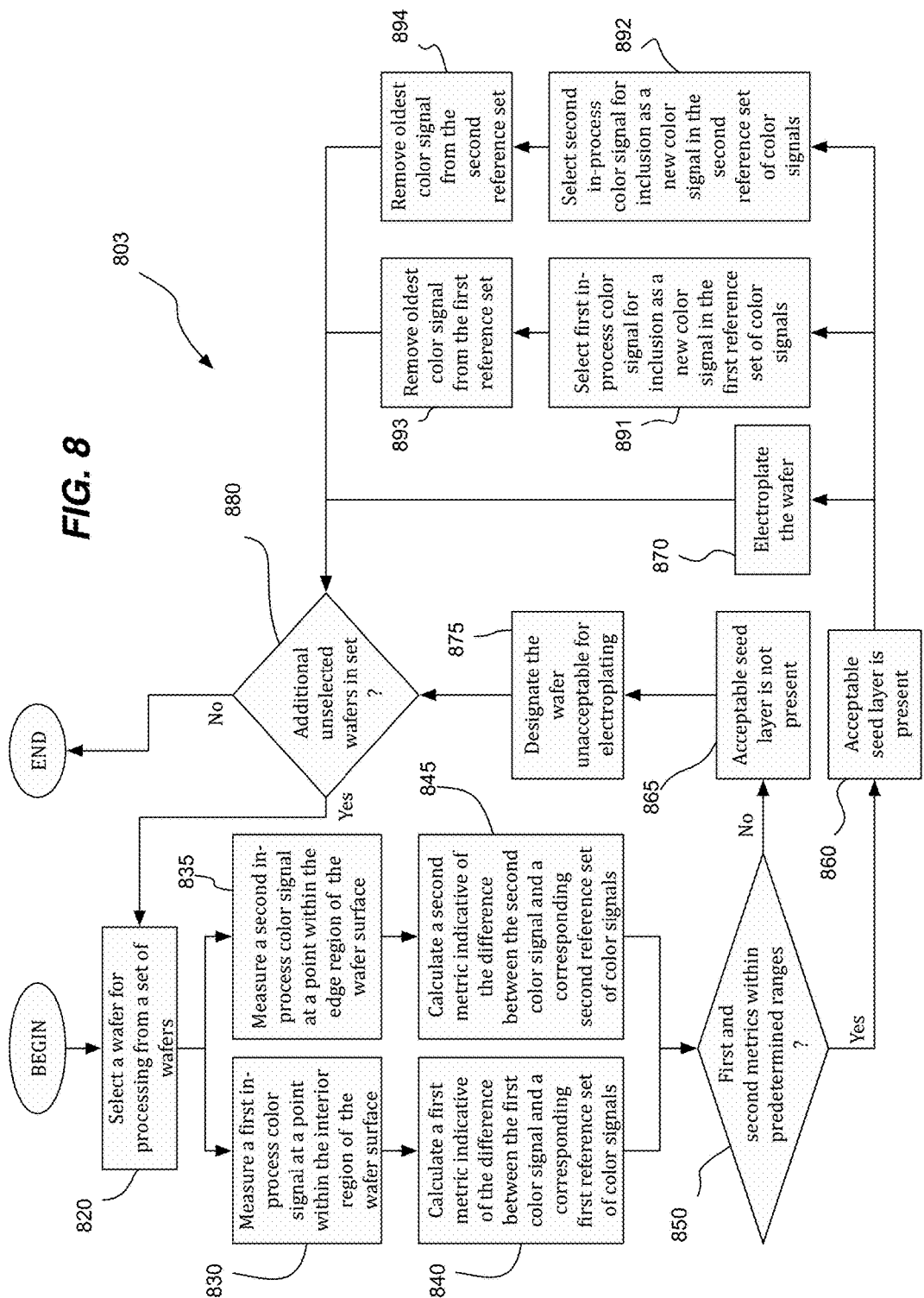
FIG. 8 schematically illustrates electroplating methods similar to those presented in FIGS. 7A and 7B, but that additionally provide a mechanism for modifying the reference sets of color signals.

Certain such methods are schematically illustrated in FIGS. 7A, 7B, and FIG. 8. Referring to FIG. 7A, an embodiment method 800 begins by selecting a wafer for processing from the set of wafers designed for electroplating in step 820. The method may then proceed by measuring from the surface of the wafer being processed an in-process color signal at a point on the surface of the selected wafer in step 830 (for example, with color sensor 770 of FIG. 6A and/or collectively 770A, 770B, 770C of FIG. 6B), and in step 840, calculating a metric indicative of the difference between the in-process color signal and a corresponding reference set of color signals (for example, utilizing color analysis logic 780 of FIGS. 6A and B). Note that, in some embodiments, the in-process color signal may be measured at a point within the interior region of the surface of the wafer being processed, and that the corresponding reference set of color signals may have been previously measured from points within the interior regions of the surfaces of several wafers having acceptable seed layers present.

If the metric is within a predetermined range corresponding to the metric, as determined in step 850, then an acceptable seed layer is determined to be present in step 860, and the method proceeds with electroplating the wafer in step 870 (for example, by employing an electroplating module such as electroplating module 401 illustrated in FIG. 5). If in step 850, it is determined that the metric is not within the predetermined range corresponding to that metric, then an acceptable seed layer is determined to not be present in step 865, the wafer is designated as unacceptable for electroplating in step 875, and the electroplating step 870 is bypassed. In either event, whether or not the selected wafer is electroplated, the method proceeds to step 880 where it is determined whether there remain additional wafers from the set of wafers to be electroplated which have not yet been selected for analysis and possible electroplating. If additional unselected wafers remain, the method proceeds back to step 820 and one of these unselected wafers is selected, and the steps of the method continue. On the other hand, if all wafers in the set of wafers designated for possible electroplating have been already selected, the method ends.

In certain methods, multiple in-process color signals may be measured from the surface of the wafer selected for processing, multiple metrics may be calculated each indicative of the difference between one of the in-process color signals and a corresponding set of reference color signals, and an acceptable seed layer may be determined to be present if each of the one or more metrics are within the associated predetermined range which individually corresponds to that metric. Certain such methods may further include measuring the sets of reference color signals corresponding to the one or more measured in-process color signals, and in certain such methods, the sets of reference color signals may be measured from the surface of one or more reference wafers at points substantially corresponding to the points where the in-process color signals are measured from the surfaces of the wafers being processed. In some embodiments, reference color signals may be measured from points whose locations are substantially the same across the multiple reference wafers, whereas in other embodiments, the locations of the points on the surfaces of the multiple reference wafers may be chosen randomly. In certain embodiments, the locations of the points on the surfaces of the one or more reference wafers at which the color signals are measured in are a fixed set of repeated azimuthal and radial positions relative to the wafer edge and alignment notch for each of the one or more reference wafers.

FIG. 7B schematically illustrates a variety of electroplating methods which are similar to those presented in FIG. 7A, but that additionally employ the use of a second color signal measured at a point within the edge regions of the surfaces of the wafers being processed (for example, with color sensor 771 of FIG. 6A), as an additional diagnostic tool. In these sorts of methodologies/configurations, it is often desirable that the first color signal be measured at a point within the interior region of the wafer surface (for example, with color sensor 770 of FIG. 6A).

Thus, after a wafer is selected for processing in step 820, the method 801 measures a first in-process color signal at a point within the interior region of the surface of the selected wafer at step 830 and also measures, at step 835, a second color signal at a point within the edge region of the surface of the same wafer. These steps may happen sequentially or serially, or they may happen somewhat contemporaneously or in parallel as is schematically illustrated in the figure. After the first in-process color signal is measured, in step 840 (as in the method of FIG. 7A), a first metric is calculated which is indicative of the difference between the first color signal and a corresponding first reference set of color signals. Likewise, after the second in-process color signal is measured, in step 845, a second metric is calculated which is indicative of the difference between the second color signal and a corresponding second reference set of color signals. In certain such embodiments, the first reference set of color signals may have been measured from points within the interior regions of the surfaces of several wafers having acceptable seed layers present, and likewise, the second reference set of color signals may have been measured from points within the edge regions of the surfaces of several wafers having acceptable seed layers present.

With both metrics calculated, in step 850 it is determined whether first and second metrics are within an appropriate predetermined range corresponding to each—note, depending on the embodiment, it is likely that the predetermined range corresponding to the first metric will be different than the predetermined range appropriate for the second metric, for example, in some embodiments where a color signal is measured from the wafer's edge region and another color signal is measured from the wafer's interior region. If both metrics satisfy their respective criteria, it is determined in step 860 that an acceptable seed layer is present, and the method proceeds to electroplate the wafer (step 870) and so on, similarly to the method presented and described with respect to FIG. 7A. Otherwise, if either metric fails to fall within its associated predetermined range at step 850, then it is determined that an acceptable seed layer is not present (step 865), the wafer is designated unacceptable for electroplating (step 875), and the method proceeds, again, similarly to the method presented and described with respect to FIG. 7A.

It is noted that first and second metrics may be calculated from first and second measured color signals as described above. Thus, in some embodiments, the first metric may be indicative of the magnitude of the vector difference between the first color signal (e.g., measured from a point within the interior region of the wafer) and a vector average of the first reference set of color signals (e.g., measured from points within the interior regions of wafers known to have an acceptable seed layer present)—and the first predetermined range associated with the first metric may be indicative of the average deviation associated with the vector average of the first reference set of color signals. Likewise, in some embodiments, the second metric may be indicative of the magnitude of the vector difference between the second color signal (e.g., measured from a point within the edge region of the wafer) and a vector average of the second reference set of color signals (e.g., measured from points within the edge regions of wafers known to have an acceptable seed layer present)—and the second predetermined range associated with the second metric may be indicative of the average deviation associated with the vector average of the second reference set of color signals.

It is also noted that using a second color signal as a diagnostic tool may increase an electroplating method's ability to reliable determine whether there is or isn't an acceptable seed layer present for electroplating. Moreover, using a second color signal which is measured from the edge region of the wafer being tested may allow a method of electroplating a set of wafers to avoid electroplating (and potentially ruining) wafers which have already been electroplated. In some embodiments, this may be because a wafer which has already been electroplated will likely also have been subject to EBR (edge bevel removal), and thus the edge region of this electroplated wafer will lack the seed material (and electroplated material, if different), and as a result have a different color signature than a wafer which has had an acceptable seed layer applied (e.g., via a PVD process). Thus, measurement of color in the edge region and comparison to a reference set of signals likewise measured from the edge, may provide a useful diagnostic tool.

Figure 7C:
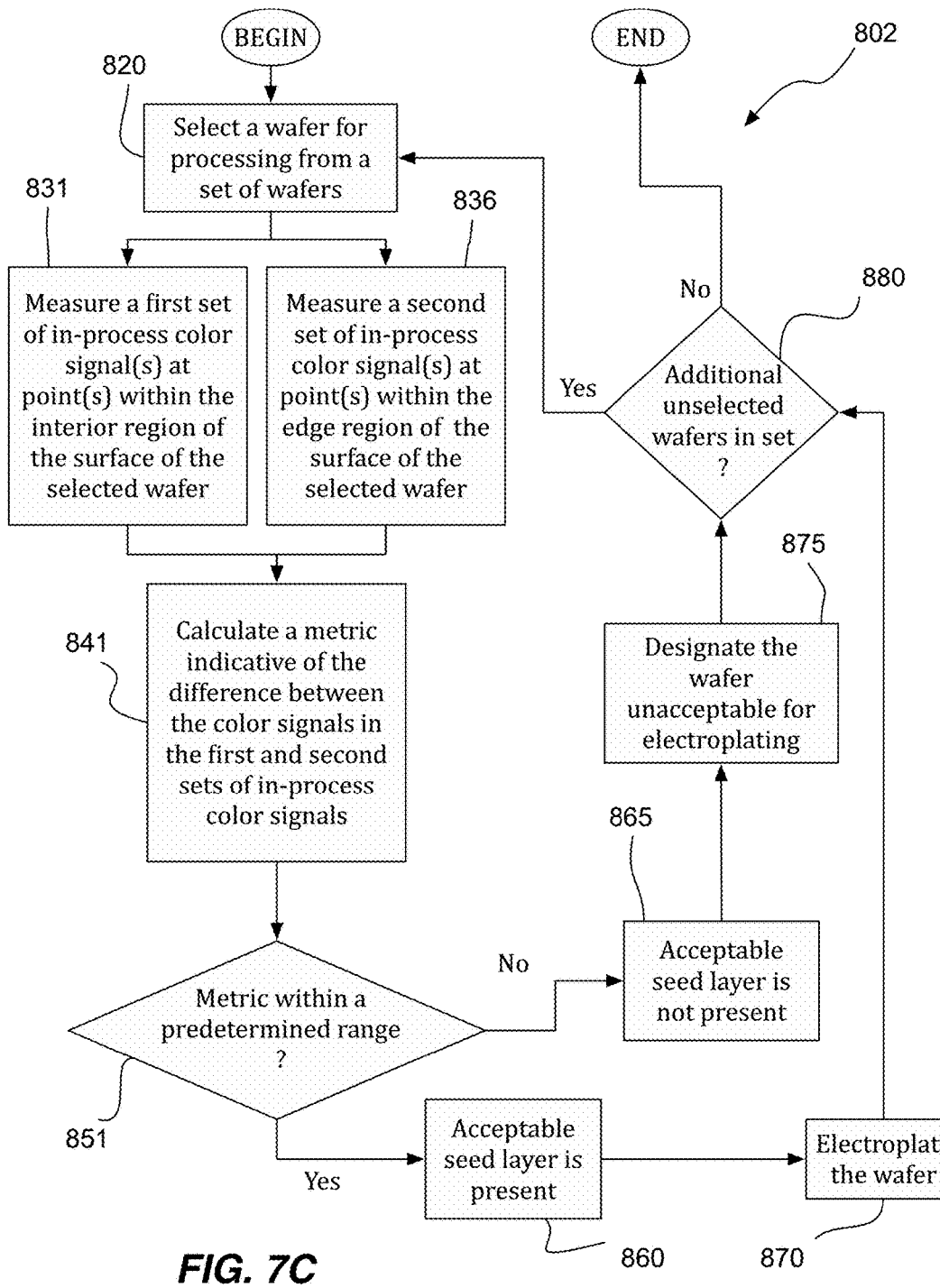
FIG. 7C schematically illustrates electroplating methods which are similar to those illustrated in FIG. 7B, but schematically illustrates use of a detection metric calculated through comparison of the in-process measured edge and interior region color signals with each other.

FIG. 7C schematically illustrates a class of electroplating methods which are similar to those presented in FIG. 7B—similar in that two in-process color signals are employed, one measured from the interior region of the wafer selected for processing and one measured from the edge region of the selected wafer—but, rather than compare these in-process color signals to corresponding reference sets as in FIG. 7B, methods 802 illustrated by FIG. 7C calculate a detection metric by comparing the two in-process color signals with each other and thereafter evaluating this metric against a predetermined range of acceptable values. Thus, in these sorts of embodiments, use of sets of reference measurements may be avoided.

Thus, referring to FIG. 7C, after a wafer is selected for processing in step 820, the method measures a first set of one or more in-process color signals from one or more points within the interior region of the surface of the selected wafer at step 831, and also measures, at step 836, a second set of one or more in-process color signal from one or more points within the edge region of the surface of the selected wafer. These steps may happen sequentially or serially, or they may happen somewhat contemporaneously or in parallel as is schematically illustrated in the figure. After the first and second sets of in-process color signals are measured, in step 841, a metric is calculated indicative of the difference between the color signals in the first and second sets of in-process color signals, and in step 851 it is determined whether the metric is within an appropriate predetermined range. If the metric satisfies this criteria, it is determined in step 860 that an acceptable seed layer is present, and the method proceeds to electroplate the wafer (step 870) and so on, similarly to the methods presented and described with respect to FIGS. 7A and 7B. Otherwise, if the metric fails to fall within the predetermined range at step 851, then it is determined that an acceptable seed layer is not present (step 865), the wafer is designated unacceptable for electroplating (step 875), and the method proceeds, again, similarly to the methods presented and described above with respect to FIGS. 7A and 7B.

It is noted that in certain such embodiments, the locations of the points on the surfaces of the wafers at which the first and second sets of color signals are measured are a fixed set of repeated azimuthal and radial positions relative to the wafer edge and alignment notch of each wafer. It is also noted that, in certain embodiments, the metric calculated to gauge the difference between the first and second sets of color signals may be related to, or indicative of, the magnitude of the vector difference between the vector average of the first set of one or more in-process color signals and the vector average of the second set of one or more in-process color signals.

FIG. 8 schematically illustrates a variety of electroplating methods which are similar to those presented in FIGS. 7A and 7B—in particular, similar to FIG. 7B since a second in-process color signal measured from the edge region is employed—but that additionally provide a mechanism for modifying the first and second reference sets of color signals.

Methods illustrated by FIG. 8 proceed similarly to those presented in FIG. 7B, but after an acceptable seed layer is determined to be present in step 860, in addition to electroplating the wafer at step 870, the methods 803 modify the reference sets of color signals by selecting the first in-process color signal for inclusion as a new color signal in the first reference set of color signals in step 891, and selecting the second in-process color signal for inclusion as a new color signal in the second reference set of color signals in step 892. Moreover, in some embodiments, along with the addition of these new color signals to the reference sets, a color signal may be removed from the first reference set in step 893, and likewise, a color signal may be removed from the second reference set in step 894. In some embodiments, as indicated in the figure, it is the oldest color signal in each reference set which is removed. In this manner, in some embodiments, an electroplating method may operate by continually updating one or more reference sets of color signals based on the in-process color signals most recently measured from wafers having acceptable seed layers present. If the vector average of the color signals in a reference set are used as a basis of computing a comparison metric, this updating of the reference set may allow the vector average to be a running average over the last N wafers determined to have an acceptable seed layer present, where N is then the number of color signals in the reference set (in some embodiments).

Moreover, in some embodiments, the foregoing operations may constitute a methodology by which the one or more reference sets of color signals are established. Thus, in some embodiments where this is the case, the first N color signals added to the reference set would not be accompanied by a corresponding removal of the oldest color signal in the reference set, since the point is to increase the size of the reference set to size N. Once it reaches size N, then the oldest color signals may be removed from the reference set as more are added as illustrated in FIG. 8. It is noted that in some embodiments employing the foregoing procedure for establishing the reference set, it would be assumed that the first few wafers have acceptable seed layers present, since without a reference set established, a comparison metric cannot be computed to establish the acceptability or presence of a wafer's seed layer. However, in other embodiments, a reference set established from a previous "run" of electroplating a series of wafers may be used as the initial reference set, which is then updated in the manner just described. Accordingly, a method of electroplating a series of wafers may initialize the relevant reference sets of color signals in a variety of ways, prior to updating them in the manner schematically illustrated in FIG. 8.

Figure 9:
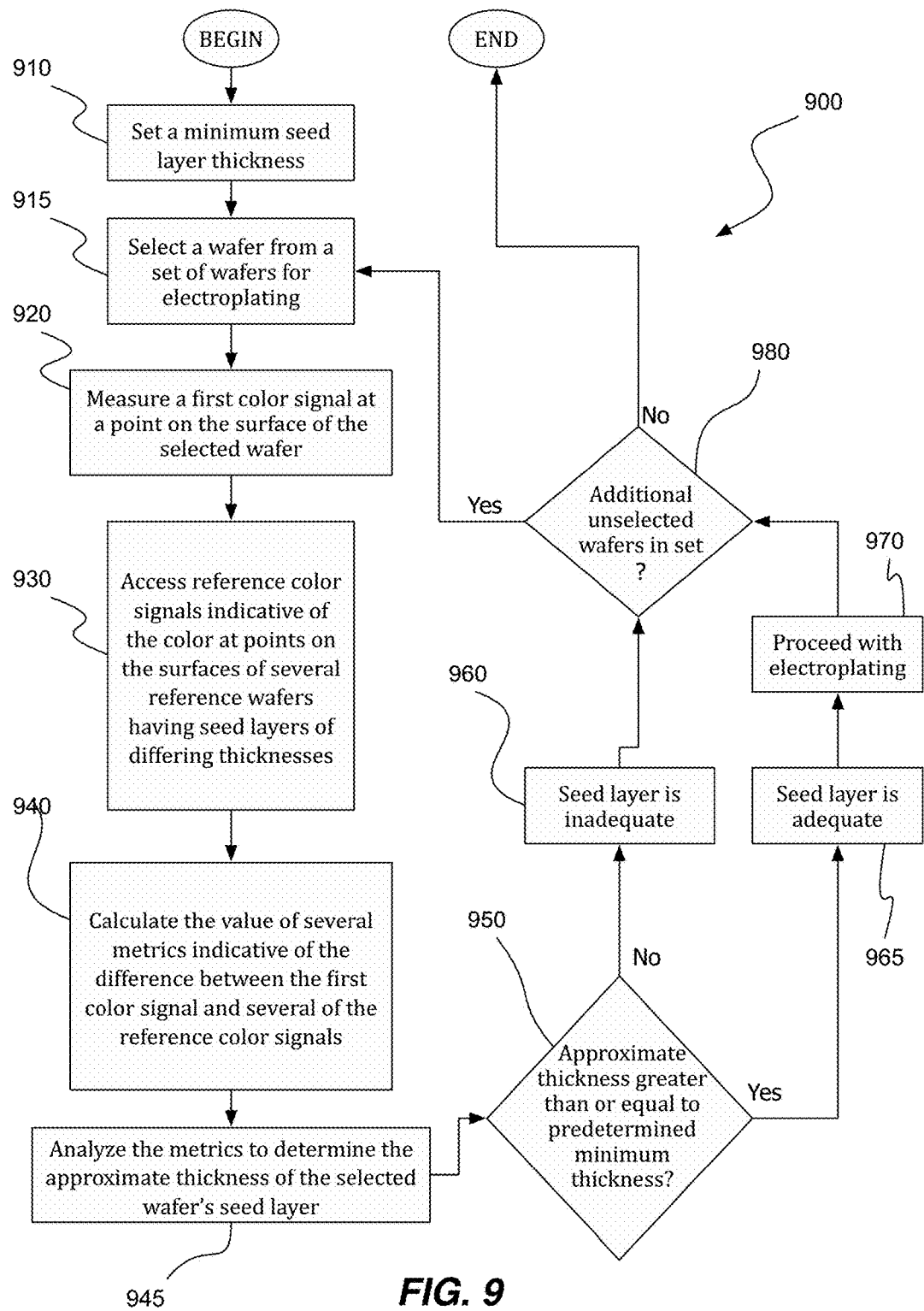
FIG. 9 presents another class of electroplating methods which take advantage of the seed layer detection and thickness determination methods disclosed herein.

FIG. 9 presents another set of methods of electroplating a set of wafers which take advantage of the seed layer detection and thickness determination methods disclosed herein. As shown in the figure, an exemplary method 900 begins by setting a minimum seed layer thickness in step 910, and selecting a wafer from the set of wafers designed for electroplating in step 915. The method may then proceed by measuring a first color signal at a point on the surface of the selected wafer in step 920, accessing reference color signals indicative of the color at point on the surfaces of several reference wafers in step 930, the reference wafers having seed layers of differing thicknesses, and in step 940, calculating the value of several metrics indicative of the difference between the first color signal and several of the reference color signals. In step 945, these metrics are then analyzed to determine the approximate thickness of the selected wafer's seed layer, and if the approximate thickness is greater than or equal to a predetermined minimum thickness as determined in step 950, the seed layer is determined to be adequate in step 965 and, in step 970, the method proceeds with electroplating the selected wafer. If in step 950, the wafer was determined to have an approximate thickness less than the predetermined minimum thickness, the seed layer is determined to be inadequate in step 960, and the electroplating step 970 is bypassed. In any event, whether or not the selected wafer is electroplated, the method proceeds to step 980 where it is determined whether there remain additional wafers in the set of wafers to be electroplated which have not yet been selected for analysis and possible electroplating. If additional unselected wafers remain, the method proceeds back to step 915 and one of these unselected wafers is selected, and the steps of the method continue. On the other hand, if all wafers in the set of wafers designated for possible electroplating have been already selected, the method ends.

System Controllers

The seed layer analysis methodologies and operations described herein, such as those operations described in reference to FIGS. 7A, 7B, 8, and 9, for example, may be implemented in program instructions which may reside on a controller of the electroplating system and/or may reside on a remote non-transitory medium which is accessible from and readable by the controller of the electroplating system. For example, in some embodiments, color analysis logic 780 of FIGS. 6A and 6B may be integrated directly into an electroplating system controller, either as a dedicated hardware component or as software running on a general purpose processor within the controller, the software loaded from a non-transitory computer readable medium within the system controller or accessible from it. FIG. 4, for example, schematically illustrates the integration of color analysis logic 399 into the controller 339 of electroplating system 307—either as dedicated hardware, or as software running on controller 339. Of course, such integration is optional and depends on the specific details of the embodiment. As indicated above, in some embodiments, the color analysis logic may be a stand-alone component, or be integrated into the color sensors internal electronics and/or processor(s) either as hardware or as software loaded from a computer readable medium.

Wherever the color analysis logic happens to reside, a seed layer analysis system as described herein may be viewed, at least in certain embodiments, as a separate system which, in certain such embodiments, is controlled and operated by the system controller of the electroplating system. Thus, the system controller of the electroplating system may communicate with the seed layer analysis system, receive and send signals to it, etc. Furthermore, the system controller may send and receive signals from other various components, modules, subsystems, etc. of the electroplating system, and may control the same or other components, modules, or subsystems by supplying control signals, etc. For instance, the system controller may control operation of electroplating substrate holders, robots, cleaning systems, post-electrofill modules, etc. that are part of the electroplating system. In certain embodiments, the controller may synchronize the operation of the various processing modules and the robots which move wafers between the various modules. Signals for monitoring processes may be provided by analog and/or digital input connections of the controller. The signals for controlling the processes are output on the analog and digital output connections of the controller.

The controller may typically include one or more memory devices and one or more processors. The processor may include a central processing unit (CPU) or computer, analog and/or digital input/output connections, stepper motor controller boards, and other like components. Machine readable program instructions for implementing appropriate control operations are executed on the processor. The machine readable instructions may be stored on the memory devices associated with the controller or they may be provided over a network.

In certain embodiments, the controller controls all or most activities of the electroplating systems described above including the operation of the seed layer analysis systems described above. The controller executes system control software including sets of instructions for controlling the timing of the processing steps, pressure levels, gas flow rates, and other parameters of particular operations. Other computer programs, scripts, or routines stored on memory devices associated with the controller may be employed in some embodiments.

Typically, there is a user interface associated with the system controller. The user interface may include a display screen and graphical software to display process conditions, results from color signal analysis, etc. Also included may be user input devices such as pointing devices, keyboards, touch screens, microphones, and other like components.

The computer program code for controlling the above operations can be written in any conventional computer readable programming language: for example, assembly language, C, C++, Pascal, Fortran or others. Compiled object code or script is executed by the processor to perform the tasks identified in the program.

Photolithographic Patterning

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or X-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, and apparatuses have been described in detail within the context of specific embodiments for the purpose of promoting clarity and understanding, it will be apparent to one of ordinary skill in the art that there are many alternative ways of implementing these processes, methods, systems, and apparatuses which are within the scope and spirit of this disclosure. Accordingly, the embodiments described herein are to be viewed as illustrative of the disclosed inventive concepts rather than limiting or restrictive, and are not to be used as an impermissible basis for unduly limiting the scope of the appended Claims.

We claim:

1. A method of electroplating a plurality of wafers from a set of semiconductor wafers, the method comprising:
   (a) selecting a wafer from the set for processing, wherein the wafer has a surface;
   (b) after (a), illuminating one or more points within an interior region of the surface of the selected wafer and measuring a first set of one or more in-process color signals from the one or more points within the interior region of the surface of the selected wafer, each color signal having one or more color components;
   (c) after (a), illuminating one or more points within an edge region of the surface of the selected wafer and measuring a second set of one or more in-process color signals from the one or more points within the edge region of the surface of the selected wafer, each color signal having one or more color components;
   (d) calculating a metric indicative of a difference between the color signals in the first and second sets of in-process color signals;
   (e) determining whether an acceptable seed layer is present on the selected wafer surface based on whether the metric is within a predetermined range; and either:
   electroplating the selected wafer when an acceptable seed layer is present; or
   otherwise designating the selected wafer unacceptable for electroplating; and
   (f) repeating (a) through (e) for one or more additional wafers from the set of wafers.

2. The method of claim 1, wherein locations of the points on the surfaces of the wafers at which the first and second sets of color signals are measured are a fixed set of repeated azimuthal and radial positions relative to the wafer edge and alignment notch of each wafer.

3. The method of claim 1, wherein:
the metric is indicative of a magnitude of a vector difference between:
a vector average of the first set of one or more in-process color signals; and
a vector average of the second set of one or more in-process color signals.

4. The method of claim 1, wherein:
(b) further comprises
detecting light reflected from the interior region with a color sensor; and
wherein (c) further comprises
detecting light reflected from the edge region with a color sensor.

5. The method of claim 1, wherein the one or more color components of the color signals of the first and second sets comprise a first color component whose value is indicative of the relative proportion of green versus red in the color signals.

6. The method of claim 1, wherein the one or more color components of the color signals of the first and second sets comprise a first color component whose value is indicative of the relative proportion of blue versus yellow in the color signals.

7. The method of claim 1, wherein:
the illuminating in (b) further comprises illuminating the one or more points within the interior region of the surface of the selected wafer with substantially white light to reflect light from the interior region, and
the illuminating in (c) further comprises illuminating the one or more points within the edge region of the surface of the selected wafer with substantially white light to reflect light from the edge region.

8. The method of claim 1, wherein locations of the points on the surfaces of the wafers at which the first and second sets of color signals are measured are chosen randomly.

9. The method of claim 1, further comprising: (g) processing, before (a), each wafer by a physical vapor deposition (PVD) tool for depositing a seed layer.

10. The method of claim 1, wherein the acceptable seed layer is a copper seed layer.

11. The method of claim 10, wherein the acceptable seed layer is a copper seed layer having a thickness of less than about 200 angstroms.

12. The method of claim 11, wherein the acceptable seed layer is a copper seed layer having a thickness of between about 50 and 150 angstroms.

13. The method of claim 1, wherein:
the first set of one or more in-process color signals in (b) includes a first color signal and a second color signal,
the second set of one or more in-process color signals in (c) includes a third color signal and a fourth color signal,
(d) further comprises calculating a first metric indicative of a difference between the first color signal and the third color signal, and calculating a second metric indicative of a difference between the second color signal and the fourth color signal, and
(e) further comprises determining whether the acceptable seed layer is present on the wafer surface based on whether the first metric is within a predetermined range and whether the second metric is within a predetermine range.

14. The method of claim 1, wherein the one or more color components of the first set of one or more in-process color signals and the one or more color components of the second set of one or more in-process color signals comprise a red color component.

15. The method of claim 1, wherein the one or more color components of the first set of one or more in-process color signals and the one or more color components of the second set of one or more in-process color signals comprise a first color component and a second color component.

* * * * *